(12) United States Patent
Cheng

(10) Patent No.: US 12,183,787 B2
(45) Date of Patent: Dec. 31, 2024

(54) SEMICONDUCTOR DEVICE WITH SILICIDE GATE FILL STRUCTURE

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/872,925

(22) Filed: Jul. 25, 2022

(65) Prior Publication Data

US 2022/0359656 A1    Nov. 10, 2022

Related U.S. Application Data

(62) Division of application No. 17/193,547, filed on Mar. 5, 2021.

(60) Provisional application No. 63/044,276, filed on Jun. 25, 2020.

(51) Int. Cl.
| | |
|---|---|
| *H01L 21/8234* | (2006.01) |
| *H01L 27/088* | (2006.01) |
| *H01L 29/06* | (2006.01) |
| *H01L 29/423* | (2006.01) |
| *H01L 29/49* | (2006.01) |
| *H01L 29/775* | (2006.01) |

(Continued)

(52) U.S. Cl.
CPC .... *H01L 29/0673* (2013.01); *H01L 21/82345* (2013.01); *H01L 27/088* (2013.01); *H01L 29/42392* (2013.01); *H01L 29/4966* (2013.01); *H01L 29/4975* (2013.01); *H01L 29/775* (2013.01); *H01L 29/78696* (2013.01); *H01L 29/66545* (2013.01)

(58) Field of Classification Search
CPC .......... H01L 29/4908; H01L 29/42392; H01L 29/66545; H01L 29/78696; H01L 29/4975; H01L 29/4966; H01L 21/82345; H01L 21/82342; H01L 21/82456; H01L 21/82385; H01L 21/823443; H01L 21/823835; H01L 21/823437; H01L 21/823828; H01L 21/28097; H01L 21/28088

See application file for complete search history.

(56) References Cited

U.S. PATENT DOCUMENTS

| | | |
|---|---|---|
| 6,214,731 B1 | 4/2001 | Nogami et al. |
| 9,236,267 B2 | 1/2016 | De et al. |
| 9,502,265 B1 | 11/2016 | Jiang et al. |

(Continued)

FOREIGN PATENT DOCUMENTS

| | | |
|---|---|---|
| JP | H0794727 A | 4/1995 |
| JP | H07183506 A | 7/1995 |

(Continued)

*Primary Examiner* — Yu Chen
(74) *Attorney, Agent, or Firm* — Seed IP Law Group LLP

(57) ABSTRACT

A semiconductor process system etches gate metals on semiconductor wafers. The semiconductor process system includes a machine learning based analysis model. The analysis model dynamically selects process conditions for an atomic layer etching process. The process system then uses the selected process conditions data for the next etching process.

20 Claims, 23 Drawing Sheets

(51) Int. Cl.
*H01L 29/786* (2006.01)
*H01L 29/66* (2006.01)

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,530,778 B1 | 12/2016 | Lin et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2003/0170983 A1 | 9/2003 | Basceri et al. |
| 2010/0207176 A1 | 8/2010 | Hargrove et al. |
| 2011/0139748 A1 | 6/2011 | Donnelly et al. |
| 2013/0187236 A1 | 7/2013 | Xie et al. |
| 2014/0264609 A1 | 9/2014 | Fung |
| 2015/0126023 A1 | 5/2015 | Choi et al. |
| 2017/0222005 A1* | 8/2017 | Lin ............ H01L 29/511 |
| 2018/0174920 A1 | 6/2018 | Kim et al. |
| 2018/0374926 A1 | 12/2018 | Lee et al. |
| 2019/0140066 A1 | 5/2019 | Lee et al. |
| 2019/0165123 A1 | 5/2019 | Lo et al. |
| 2019/0340316 A1* | 11/2019 | Lill ............ G06N 10/00 |
| 2020/0013899 A1 | 1/2020 | Kim et al. |
| 2020/0098643 A1 | 3/2020 | Cheng et al. |
| 2020/0343343 A1* | 10/2020 | Acton ........... H01L 21/28097 |
| 2021/0082917 A1 | 3/2021 | Park et al. |

FOREIGN PATENT DOCUMENTS

| | | |
|---|---|---|
| KR | 20180036646 A | 4/2018 |
| KR | 20180070780 A | 6/2018 |
| KR | 20180082851 A | 7/2018 |
| KR | 20190050607 A | 5/2019 |
| KR | 20200040309 A | 4/2020 |
| KR | 10-2020-0051079 A | 5/2020 |
| TW | 201250857 A | 12/2012 |
| WO | WO 2016160778 A1 | 10/2016 |
| WO | WO 2019050801 A1 | 3/2019 |

* cited by examiner

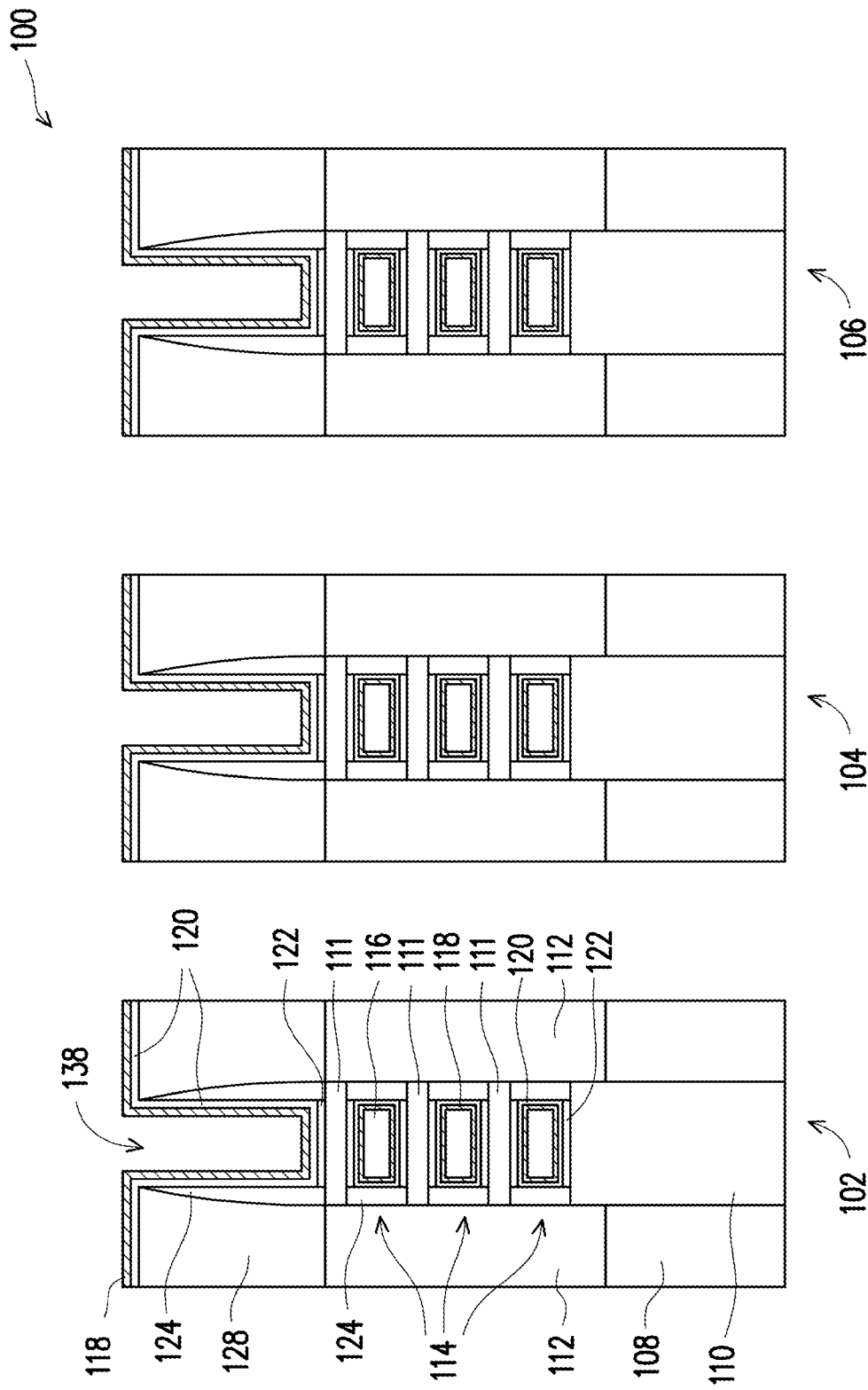

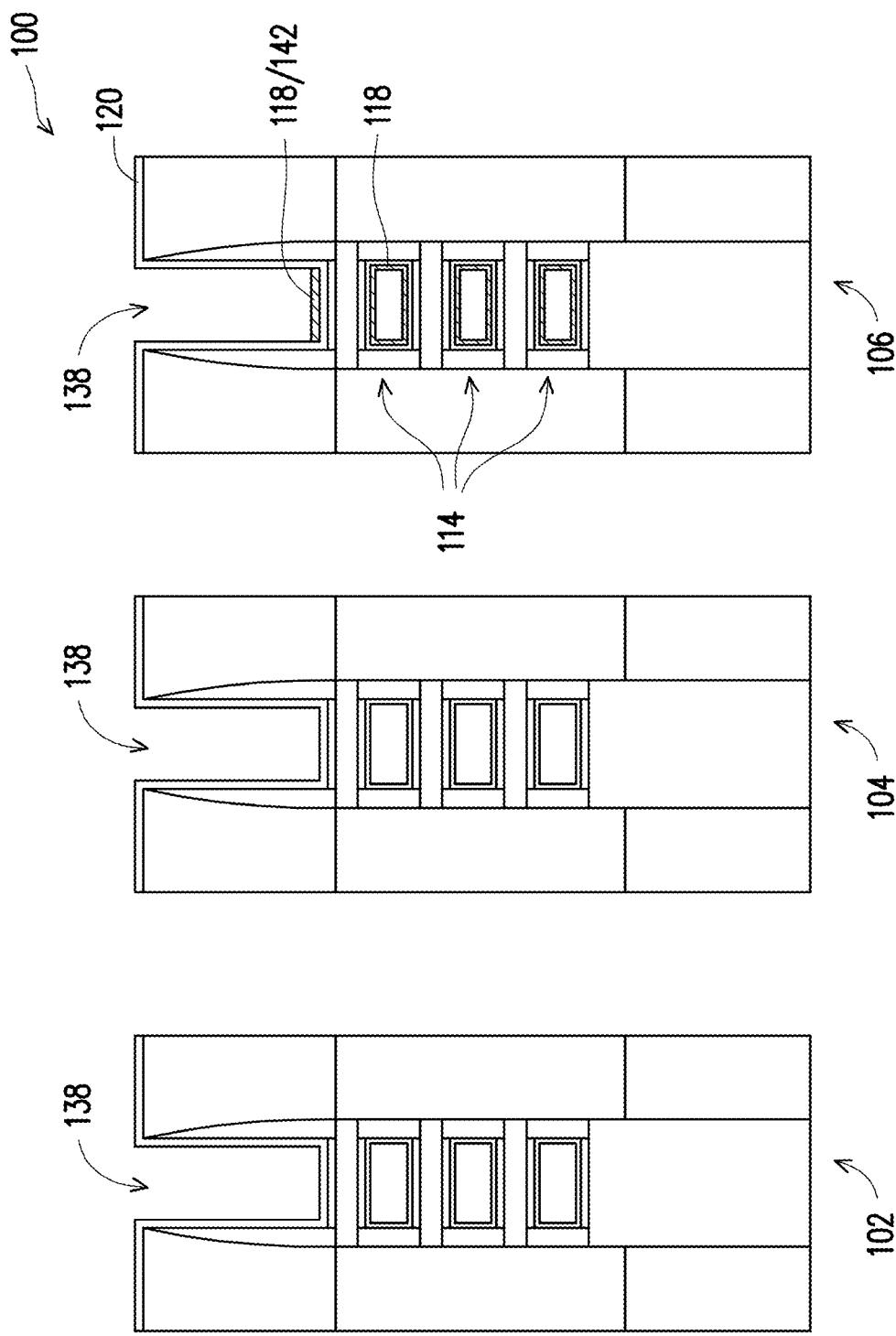

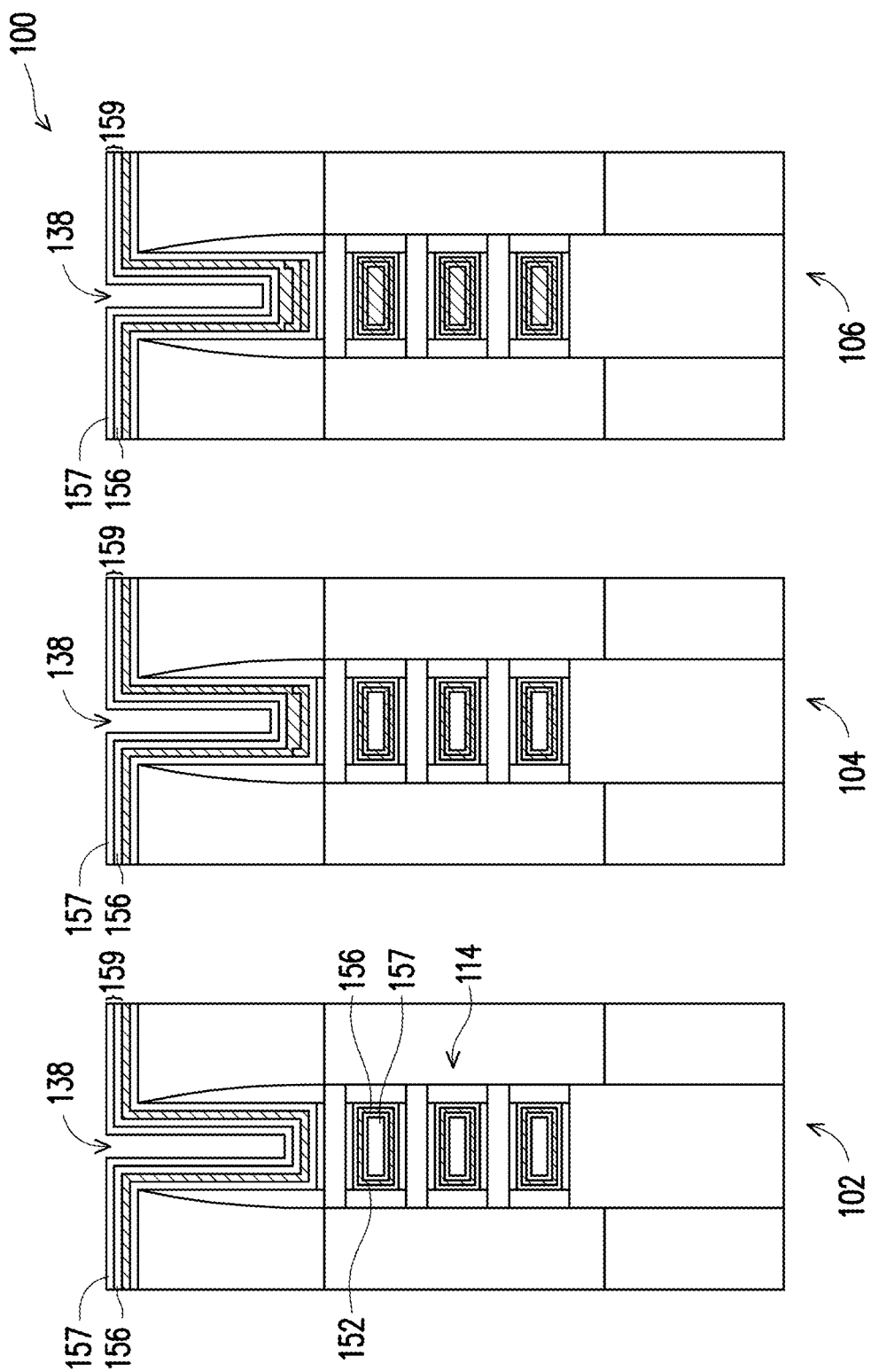

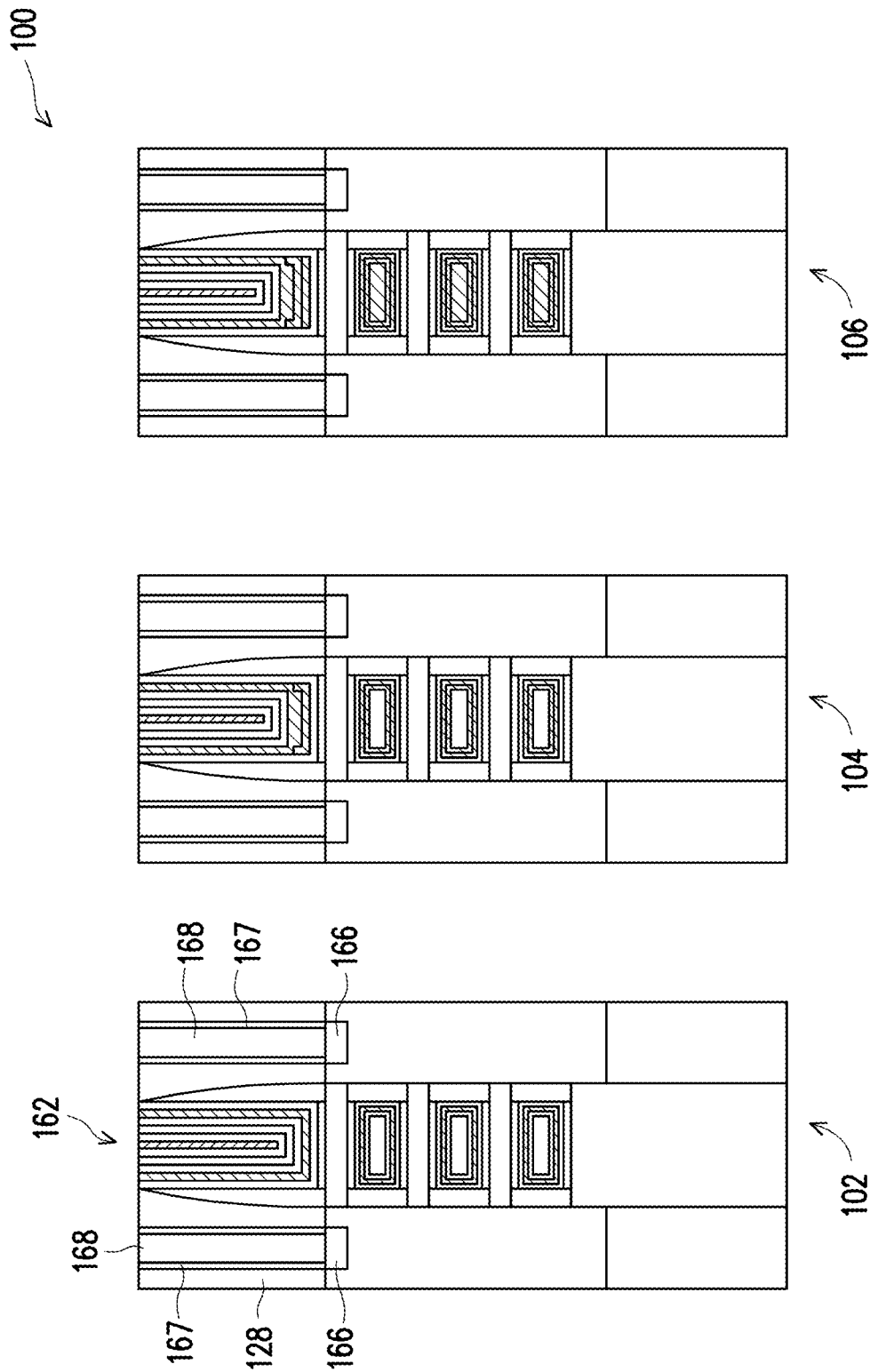

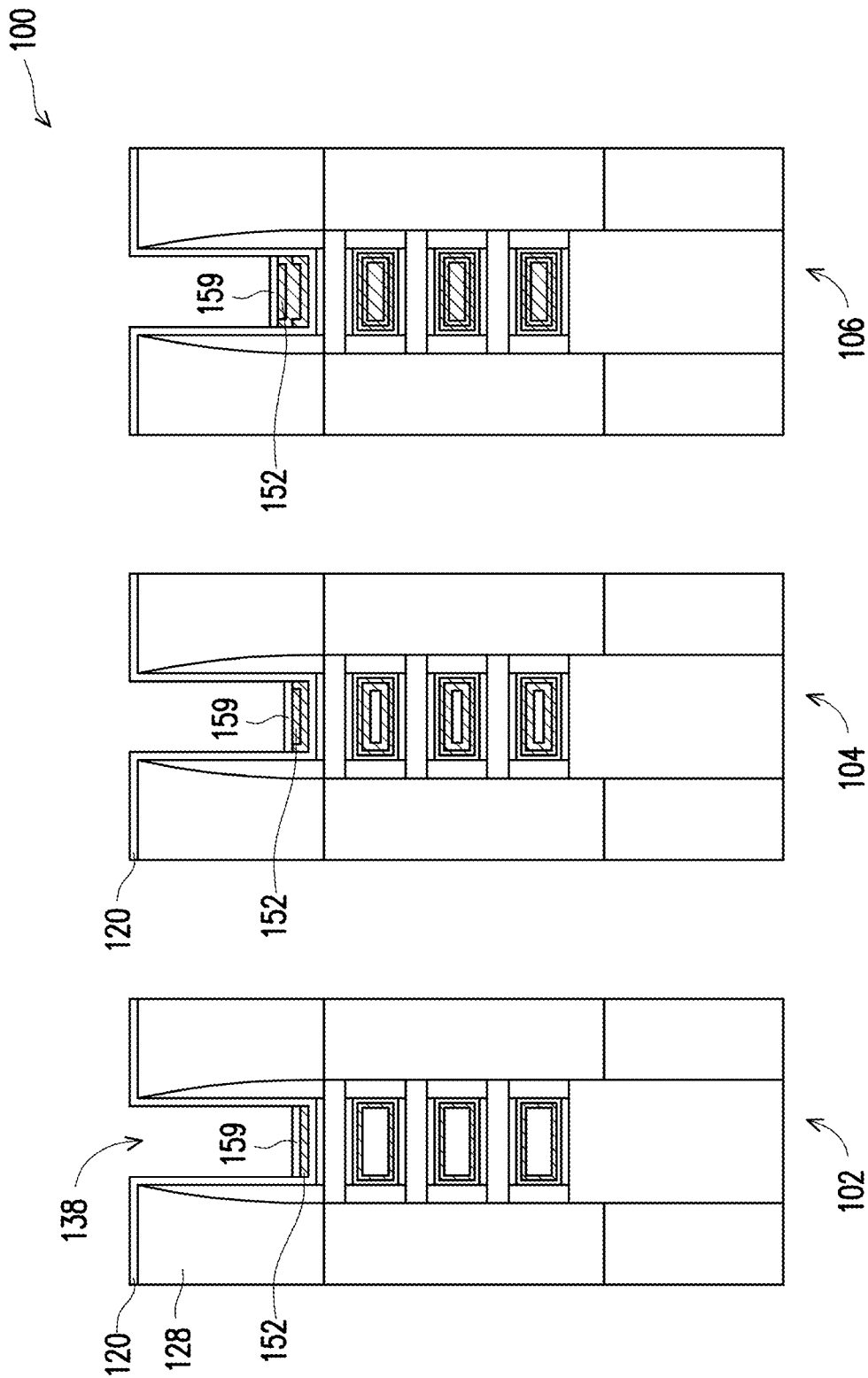

SEMICONDUCTOR DEVICE WITH SILICIDE GATE FILL STRUCTURE

BACKGROUND

Technical Field

The present disclosure relates to the field of semiconductor fabrication. The present disclosure relates more particularly to etching processes for semiconductor fabrication.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, these techniques also face serious difficulties in ensuring that the features are properly formed.

DETAILED DESCRIPTION

Figure 1B:
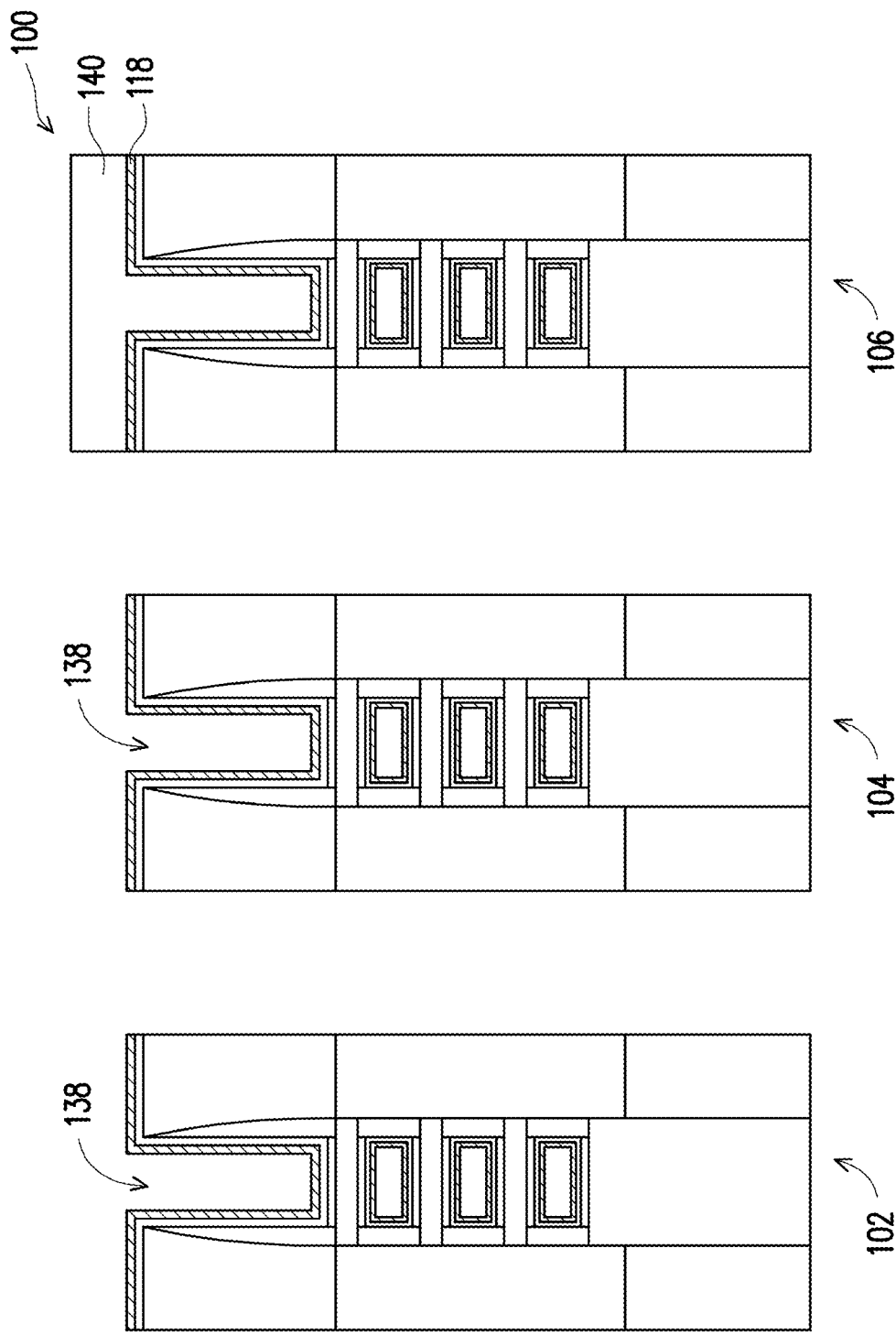
FIGS. 1A-1N are cross-sectional views of an integrated circuit at various stages of processing, according to one embodiment.
FIGS. 1O-1Q are cross-sectional views of an integrated circuit at various stages of processing, according to an alternate embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide gate all around nanosheet transistors with low resistance gate electrodes. Embodiments of the present disclosure are able to provide multiple types of gate all around transistors with differing threshold voltages while still providing low resistance gate electrodes. The differing threshold voltages are obtained by selectively including or excluding various thin gate metal layers in the gate structures. The threshold voltages of the transistors are based, in part, on the presence or absence of the thin gate metal layers in the gate structures.

The low resistance is obtained by ensuring that the thin gate metal layers do not extend very high within the gate trench so that a low resistance gate fill material can fill more of the trench. The various thin gate metal layers are carefully etched with controlled etching processes that utilize machine learning techniques.

Embodiments of the present disclosure utilize the machine learning techniques to adjust etching process parameters between etching processes or even during etching processes for etching the thin gate metal layers. Embodiments of the present disclosure utilize machine learning techniques to train an analysis model to determine process parameters that should be implemented for a next etching process or even for a next phase of a current etching process. The result is that thin-film etching processes produce thin gate metal layers having remaining thicknesses and compositions that reliably fall within target specifications. Integrated circuits that include the gate all around transistors will not have performance problems that can result if the thin gate metal layers are not properly formed. Furthermore, batches of semiconductor wafers will have improved yields and fewer scrapped wafers.

FIGS. 1A-M are cross-sectional views of an integrated circuit 100 at successive intermediate stages of processing, according to one embodiment. FIGS. 1A-M illustrated an exemplary process producing an integrated circuit that includes multiple types of transistors. Each type of transistor has a threshold voltage that is different than the other types of transistors. FIGS. 1A-M illustrate how all of these types of transistors can be formed in a simple and effective process in accordance with principles of the present disclosure. Other process steps and combinations of process steps can be utilized without departing from the scope of the present disclosure. FIGS. 1A-M illustrate a process for forming N-channel transistors of an ultra-low threshold voltage type, a low threshold voltage type, and a standard threshold voltage type. The process for forming P-channel transistors of these types is substantially the same as the process for forming the N-channel transistors except that the processes particular to the ultra-low threshold voltage transistors and the standard threshold voltage transistors are reversed for the P-channel process with respect to the N-channel process. This will be set forth in further detail below.

FIG. 1A is a cross-sectional diagram of an integrated circuit 100 at an intermediate stage of processing, according to one embodiment. The view of FIG. 1A illustrates a transistor 102, a transistor 104, and a transistor 106. Each of the transistors 102, 104, and 106 are formed in the same integrated circuit 100. The transistors 102, 104, and 106 each have different threshold voltages. At this stage of processing shown in FIG. 1A, the transistors 102, 104, and 106 have the same structures. Accordingly, in FIG. 1A, the reference numbers applied to the transistor 102 apply to the analogous structures in the transistors 104 and 106. The transistor 102 corresponds to an ultra-low threshold voltage transistor. The transistor 104 corresponds to a low threshold voltage transistor. The transistor 106 corresponds to a standard threshold voltage transistor. Put another way, the threshold voltage of the transistor 106 is greater than the threshold voltage of the transistor 104. The threshold voltage of the transistor 104 is greater than the threshold voltage of the transistor 102.

The transistors 102, 104, and 106 are gate all around (GAA) transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The integrated circuit 100 includes a semiconductor substrate 110. In one embodiment, the substrate 110 includes a single crystalline semiconductor layer on at least a surface portion. The substrate 110 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 110 is made of Si. The substrate 110 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 110 comprises silicon germanium (SiGe) buffer layers epitaxially grown on the silicon substrate 110. The germanium concentration of the SiGe buffer layers may increase from 30 atomic % germanium for the bottom-most buffer layer to 70 atomic % germanium for the top-most buffer layer. The substrate 110 may include various regions that have been suitably doped with impurities (e.g., p-type or n-type conductivity). The dopants are, for example boron ($BF_2$) for an n-type transistor and phosphorus for a p-type transistor.

The integrated circuit 100 includes a shallow trench isolation 108. The shallow trench isolation 108 can be utilized to separate groups of transistor structures formed in conjunction with the semiconductor substrate 110. The shallow trench isolation 108 can include a dielectric material. The dielectric material for the shallow trench isolation 108 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. Other materials and structures can be utilized for the shallow trench isolation 108 without departing from the scope of the present disclosure.

The integrated circuit 100 includes a plurality of semiconductor nanosheets 111 or nanowires. The semiconductor nanosheets 111 are layers of semiconductor material. The semiconductor nanosheets 111 correspond to the channel regions of the transistors 102, 104, and 106. The stacked semiconductor nanosheets 111 are formed over the substrate 110. The semiconductor nanosheets 111 may include one or more layers of Si, Ge, Site, GaAs, InSb GaP GaSb, InAlAs, InGaAs, GaSbP, GaAsSb or InP. In one embodiment, the semiconductor nanosheets 111 are the same semiconductor material as the substrate 110. Other semiconductor materials can be utilized for the semiconductor nanosheets 111 without departing from the scope of the present disclosure.

In FIG. 1A each transistor 102, 104, and 106 have three semiconductor nanosheets 111. However, in practice, each transistor 102, 104, and 106 may have many more semiconductor nanosheets 111 than three. For example, each transistor 102 may include between 8 and 20 semiconductor nanosheets 111. Other numbers of semiconductor nanosheets 111 can be utilized without departing from the scope of the present disclosure.

The semiconductor nanosheets 111 can have thicknesses between 2 nm and 50 nm. In one embodiment, the semiconductor nanosheets 111 have thicknesses between 5 nm and 20 nm. In one embodiment, each nanosheet 111 is thicker than the nanosheets 111 above it. In one embodiment, each nanosheet 111 is shorter than the nanosheets above it. The semiconductor nanosheets 111 can have other thicknesses without departing from the scope of the present disclosure.

The integrated circuit 100 includes gate structures 114. The gate structures 114 are positioned between the semiconductor nanosheets 111. In practice, the gate structures 114 surround the nanosheets 111, except where the nanosheets 111 meet the source and drain regions 112. At the stage of processing shown in FIG. 1A, each gate structure 114 includes a high-K dielectric layer 120, an interfacial dielectric layer 122, a first gate metal 118, and a void 116. The high-K dielectric layer 120 and the interfacial dielectric layer 122 collectively form a gate dielectric of the transistors 102, 104, and 106. The high-K dielectric layer 120 and the interfacial dielectric layer 122 physically separate the semiconductor nanosheets 111 from the metal or metals of the gate structures 114. At the stage of processing shown in FIG. 1A, only the first gate metal 118 is present. However, after further stages of processing, other gate metals will be present in the gate structures 114. The high-K dielectric layer 120 and the interfacial dielectric layer 122 isolate these gate metals from the semiconductor nanosheets 111 correspond to the channel regions of the transistors.

The interfacial layer may be used in order to create a good interface between the semiconductor nanosheets 111 and the gate structures 114, as well as to suppress the mobility degradation of the channel carrier of the semiconductor device. The interfacial dielectric layer 122 can include a dielectric material such as silicon oxide, silicon nitride, or other suitable dielectric material. The interfacial dielectric layer 122 can be formed by a thermal oxidation process, a chemical vapor deposition (CVD) process, or an atomic layer deposition (ALD) process. The interfacial dielectric layer 122 can have a thickness between 0.5 nm and 3 nm. The thickness of the interfacial dielectric layer 122 may be greater on lower nanosheets 111. Other materials, deposition processes, and thicknesses can be utilized for the interfacial dielectric layer 122 without departing from the scope of the present disclosure.

The high-K dielectric layer 120 includes one or more layers of a dielectric material, such as silicon oxide, silicon nitride, $HfO_2$, HfSiO, HfSiON, HfTaO, HfTiO, HfZrO, zirconium oxide, aluminum oxide, titanium oxide, hafnium dioxide-alumina. ($HfO_2$—$Al_2O_3$) alloy, other suitable high-k dielectric materials, and/or combinations thereof. The high-K dielectric layer 120 may be formed by CVD, ALD, or any suitable method. In one embodiment, the high-K dielectric layer 120 is formed using a highly conformal deposition process such as ALD in order to ensure the formation of a gate dielectric layer having a uniform thickness around each semiconductor nanosheet 111. In one embodiment, the thickness of the high-k dielectric is in a range from about 1 nm to about 6 nm. Other thicknesses, deposition processes, and materials can be utilized for the high-K dielectric layer 120 without departing from the scope of the present disclosure. The high-K dielectric layer 120 may include a first layer that includes HfO2 with dipole doping including La and Mg, and a second layer including a higher-K ZrO layer with crystallization. The high-k dielectric layer can be patterned with controlled ALE processes, as will be described in further detail below. The peak intensity of oxygen in the high-K dielectric layer can be higher for the transistor 106 than for the transistors 102 and 104.

In one embodiment, the first gate metal 118 includes titanium nitride. The first gate metal 118 can be deposited using physical vapor deposition (PVD), atomic layer deposition, chemical vapor deposition, or other suitable deposition processes. The first gate metal 118 can have a thickness between 1 nm and 5 nm. The gate metal 118 can include metals such as Ti, Ta, W, Mo, and compounds of oxygen and nitrogen. Accordingly, the gate metal can include TaN, WN, and MoN. Other materials, deposition processes, and thicknesses can be utilized for the first gate metal 118 without departing from the scope of the present disclosure.

The gate structures 114 can also include sidewall spacers 124. The sidewall spacers 124 can include multiple layers of dielectric material. The multiple layers of dielectric material can include silicon nitride, SiON, SiOCN, SiCN, silicon oxide, or other dielectric materials. Other dielectric materials can be utilized for the sidewall spacers 124 without departing from the scope of the present disclosure.

The source and drain regions 112 includes semiconductor material. The source and drain regions 112 can be grown epitaxially from the semiconductor nanosheets 111. The source and drain regions 112 can be epitaxially grown from the semiconductor nanosheets 111 and other semiconductor layers that previously occupied the locations of the gate structures 114. The source and drain regions 112 can be doped with N-type dopants species in the case of N-type transistors. The source and drain regions 112 can be doped with P-type dopant species in the case of P-type transistors.

The integrated circuit 100 includes an interlayer dielectric layer 128 positioned on the source and drain regions 112. The interlayer dielectric layer 128 can include one or more of silicon oxide, silicon nitride, SICOH, SiOC, or an organic polymer. Other types of dielectric materials can be utilized for the interlayer dielectric layer 128 without departing from the scope of the present disclosure.

The integrated circuit 100 includes trenches 138 formed in the interlayer dielectric layer 128. The trenches 138 correspond to future metal gate region of the transistors 102, 104, and 106. The trench 138 is bounded by first sidewall spacers 134. The first sidewall spacers 134 are the same material as the sidewall spacers 124 the gate structures 114 and can be formed in the same deposition process. The bottom of the trench 138 includes the interfacial dielectric layer 122. The portion of the interfacial dielectric layer 122 formed on the top surface of the uppermost semiconductor nanosheet 111 at the bottom of the trench 138 is formed in the same process as the interfacial dielectric layer 122 of the gate structures 114. The high-K dielectric layer 120 is formed on the top surface of the interlayer dielectric layer 128, on the sidewalls of the trench 138, and on top of the portion of the interfacial dielectric layer 122 at the bottom of the trench 138. The first gate metal 118 is formed on the high-K dielectric layer 122 in the trench and on top of the interlayer dielectric layer 128. The bottom of each trench 138 is the top surface of the corresponding upper most semiconductor nanosheet 111.

As set forth previously, at the point in processing shown in FIG. 1A, the transistor 102, the transistor 104, and the transistor 106 have identical structures. In subsequent processing steps, differentiations will be made in forming the gate metals of each of the transistors 102, 104, and 106.

The bottom of each trench 138 is the top surface of the corresponding upper most semiconductor nanosheet 111.

In FIG. 1B a mask 140 has been formed on the first gate metal layer 118 of the transistor 106. The mask fills the trench 138 of the transistor 106. The mask 140 is patterned so that the mask is not present on the first gate metal layer 118 of the transistor 102 and the transistor 104. Accordingly, the first gate metal 118 is exposed for the transistor 102 and the transistor 104. The mask 140 can include patterned photo resist. The patterned photoresist can be implemented using standard photolithography processes.

Figure 1C:
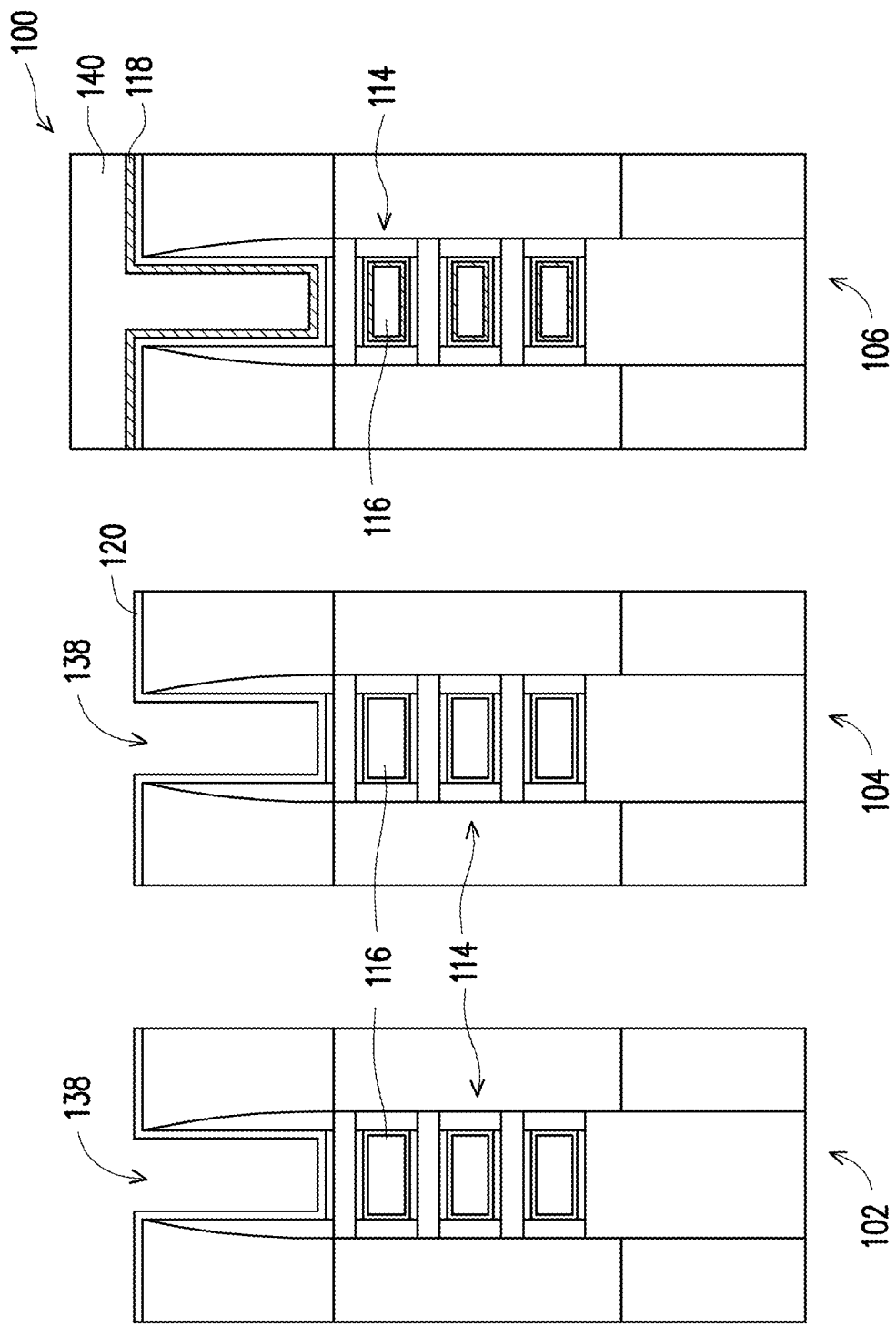

In FIG. 1C, the first gate metal 118 has been removed at the transistor 102 and the transistor 104. Of note, the first gate metal 118 is removed in both the trenches 138 and from the gate structures 114 of the transistor 102 and the transistor 104. One result of this is that the voids 116 of the gate structures 114 of the transistor 102 and the transistor 104 are larger than the voids 116 of the gate structures 114 of the transistor 106 in which the first gate metal 118 is still present. The first gate metal 118 can be removed by a wet etch, dry etch, or any other suitable etching process.

Figure 1D:
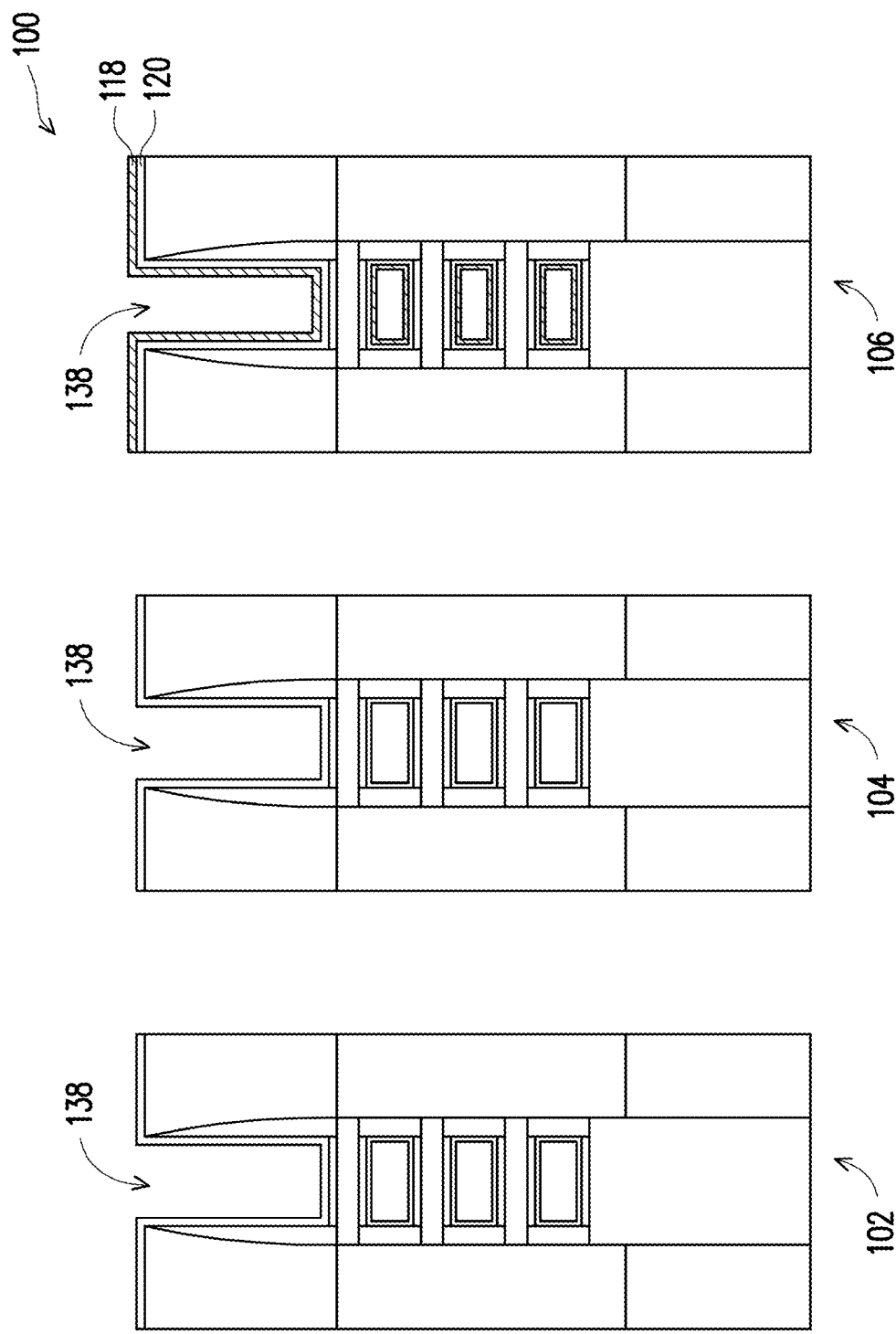

In FIG. 1D, the photoresist mask 140 has been removed from the transistor 106. Accordingly, the first gate metal 118 is exposed at the transistor 106. The photoresist mask 140 can be removed by any standard photo resist removal process.

In FIG. 1E, the first gate metal 118 has been etched back within the trench 138 of the transistor 106. The first gate metal 118 has not been entirely removed from the trench 138 of the transistor 106. Instead, the first gate metal 118 has been etched back with a control etch that is selected to leave a remaining portion 142 of the first gate metal 118 on the high-K dielectric layer 120 at the bottom of the trench 138 of the transistor 106 while removing the first gate metal 118 from the high-K dielectric layer 120 on the sidewalls of the trench 138. Accordingly, in one example, the first gate metal 118 is removed from the sidewalls of the trench 138 while leaving a remaining portion 142 at the bottom of the trench 138.

In one embodiment, the controlled etching process for etching back the first gate metal 118 is an atomic layer etching (ALE) process. In one embodiment, the ALE process is used to etch the titanium nitride first gate metal 118 to produce the structure shown in transistor 106 of FIG. 1E. An ALE process is similar to an atomic layer deposition process (ALD). In an atomic layer etching process, different gases, fluids, or materials are flowed into the process chamber for selected periods of time. Each cycle of an ALE process includes flowing multiple materials at different stages. Each cycle can result in the removal of an atomic or molecular layer of the titanium nitride first gate metal 118.

In one example, an ALE cycle includes flowing WCl5 into the process chamber for a selected period of time, for example between 1 s and 10 s. The ALE cycle then includes a purge phase in which argon gas is flowed into the process chamber for a selected period of time, for example between 6 s and 15 s. The ALE cycle then includes flowing $O_2$ into the processing chamber for a selected amount of time, for example between 1 s and 10 s. The ALE cycle then includes a second purge phase in which argon gas is flowed into the process chamber for selected period of time, for example between 2 s and 15 s. Each cycle results in the removal of an atomic or molecular layer of the titanium nitride first gate metal 118. By controlling the number of cycles in an ALE process, the amount of the titanium nitride layer first gate metal 118 to be etched can be tightly controlled. Other ALE processes, cycles, durations, and materials can be utilized without departing from the scope of the present disclosure.

As will be described in more detail below, machine learning processes are utilized to dynamically select parameters for the ALE process. The machine learning process trains an analysis model to dynamically select the parameters for each ALE process. The analysis model can select materials, flow durations, flow pressures, temperatures, and other parameters associated with ALE processes in order to remove the desired amount of the titanium nitride first gate metal. Although this description describes an example in which the first gate metal 118 is titanium nitride, the first gate metal 118 can include other materials than titanium nitride without departing from the scope of the present disclosure.

Figure 1F:
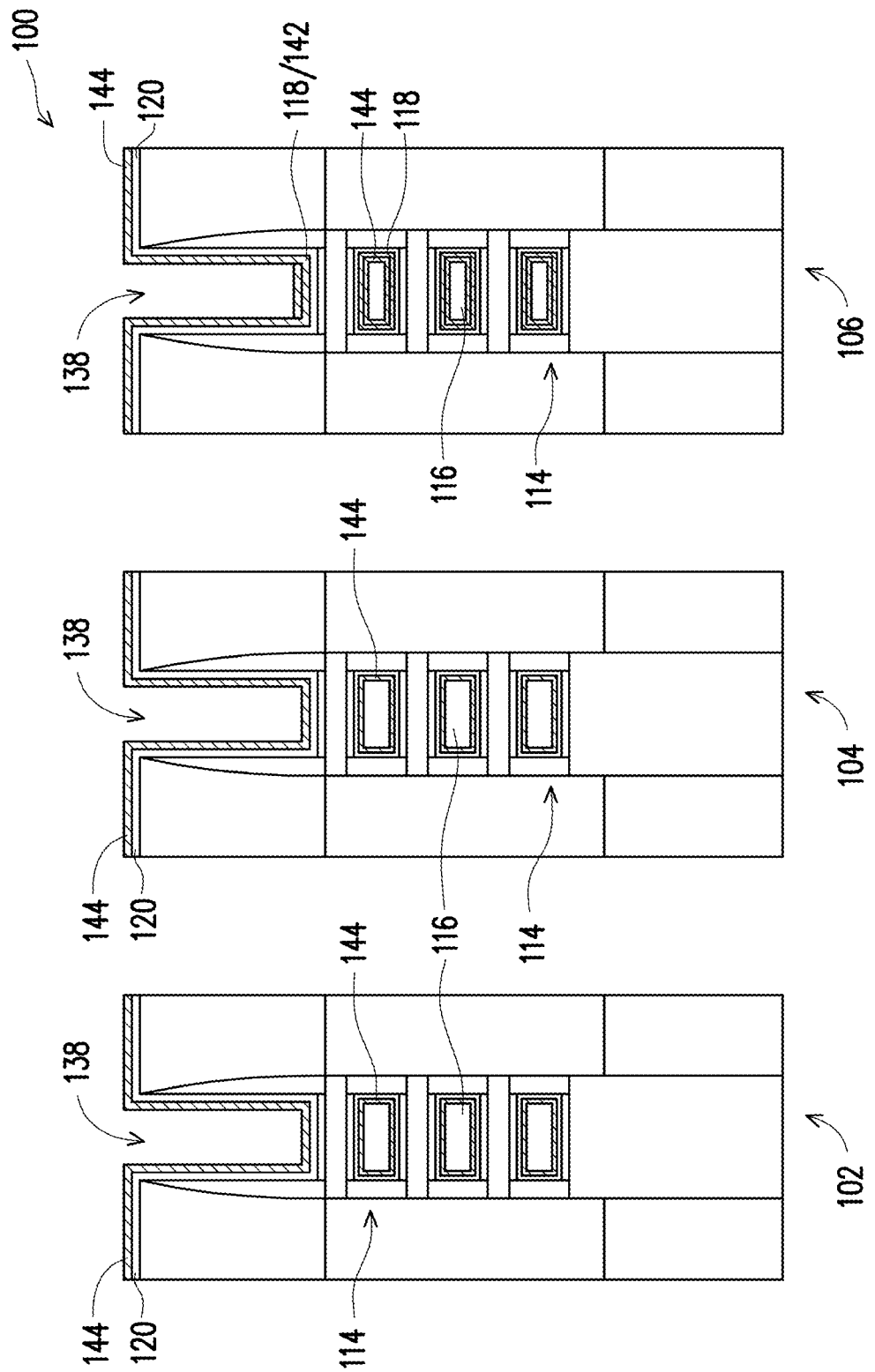

In FIG. 1F, a second gate metal 144 has been deposited on the integrated circuit 100. In particular, the second gate metal 144 is deposited on the high-K dielectric layer 120 in the trenches 138 and in the voids 116 of the transistor 102, the transistor 104, 106. The second gate metal 144 is deposited on the remaining portion 142 of the first gate metal at the bottom of the trench 138 and on the first gate metal 118 within the voids 116 of the transistor 106. The second gate metal 144 can be deposited by a PVD process, a CVD process, or an ALD process. The second gate metal includes titanium nitride, in one example. Alternatively, the second gate metal 144 can include one or more of TaN, WN, MoN, or other suitable materials. The second gate metal 144 can have a thickness between 1 nm and 5 nm. The second gate metal 144 can be the same material or a different material than the first gate metal 118. Other materials, deposition processes, and thicknesses can be utilized for the second gate metal 144 without departing from the scope of the present disclosure.

Figure 1G:
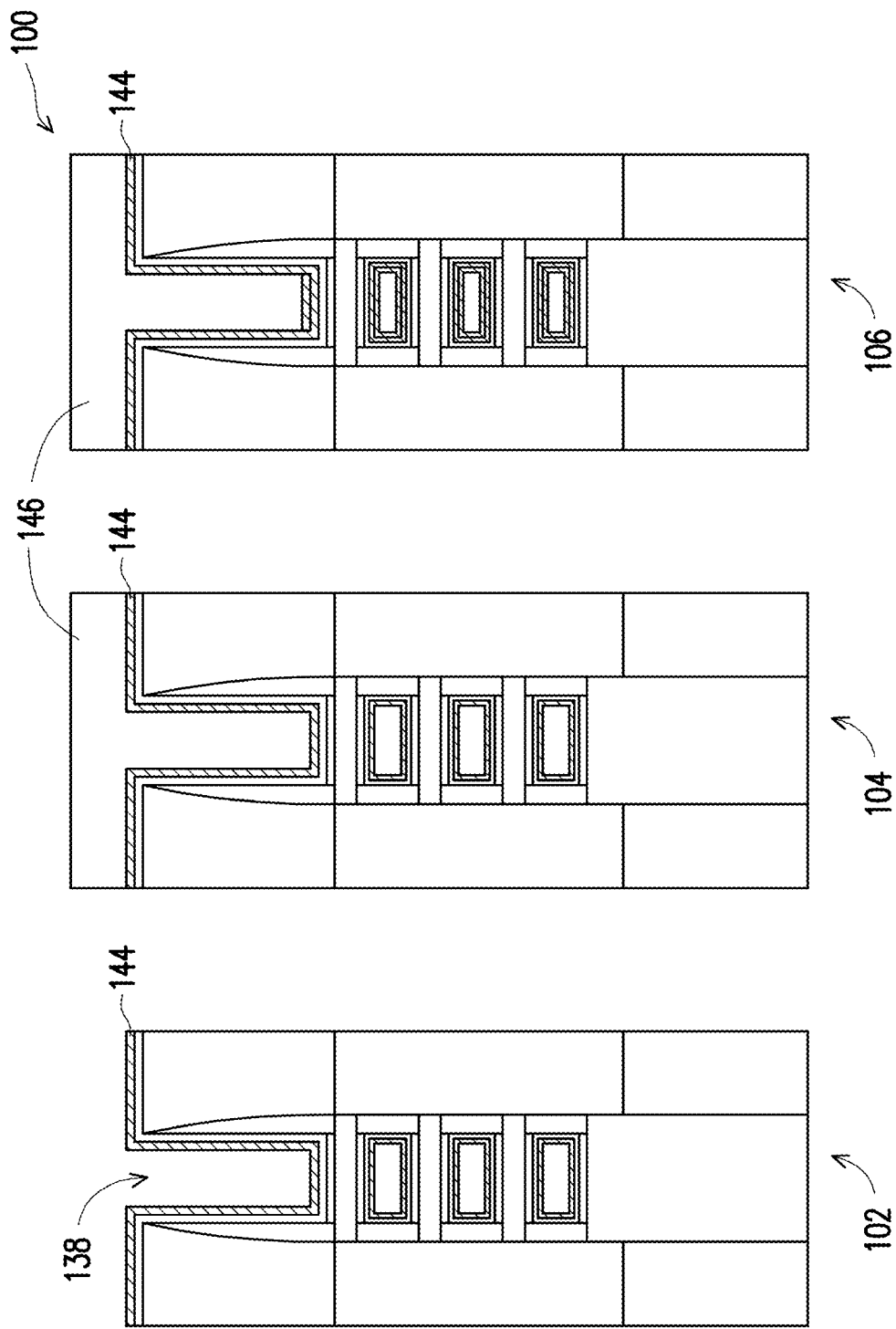

In FIG. 1G a mask 146 has been formed on the second gate metal 144 of the transistor 104 and the transistor 106. The mask 146 fills the trenches 138 of the transistor 104 and the transistor 106. The mask 146 is patterned so that the mask is not present on the second gate metal layer 144 of the transistor 102. Accordingly, the second gate metal layer 144 is exposed for the transistor 102. The mask 140 can include patterned photo resist. The patterned photoresist can be implemented using standard photolithography processes.

Figure 1H:
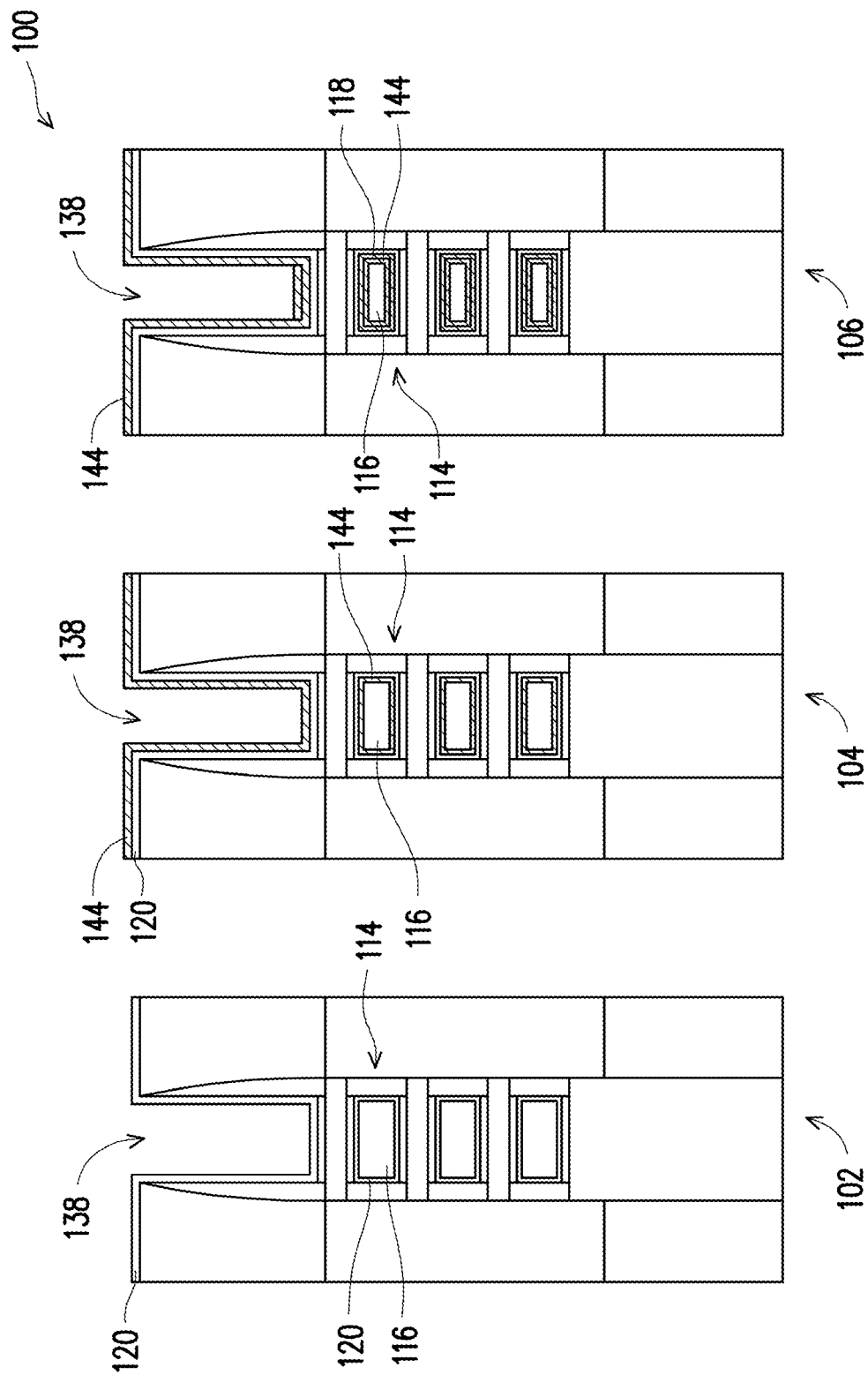

In FIG. 1H, the second gate metal 144 has been removed at the transistor 102. Of note, the second gate metal 144 is removed in both the trench 138 and from the gate structures 114 of the transistor 102. One result of this is that the voids 116 of the gate structures 114 of the transistor 102 is larger than the voids 116 of the gate structures 114 of the transistor 104 in which the second gate metal 144 is still present. The voids 116 of the gate structures 114 of the transistor 104 are larger than the voids 116 of the gate structures 114 of the transistor 106 in which the first gate metal 118 and the second gate metal 144 are still present. The second gate metal 144 can be removed by a wet etch, dry etch, or any other suitable etching process.

In FIG. 1H, the photoresist mask 146 has been removed from the transistor 104 and the transistor 106. Accordingly, the second gate metal 144 is exposed at the transistor 104 and the transistor 106. The photoresist mask 146 can be removed by any standard photo resist removal process.

Figure 1I:
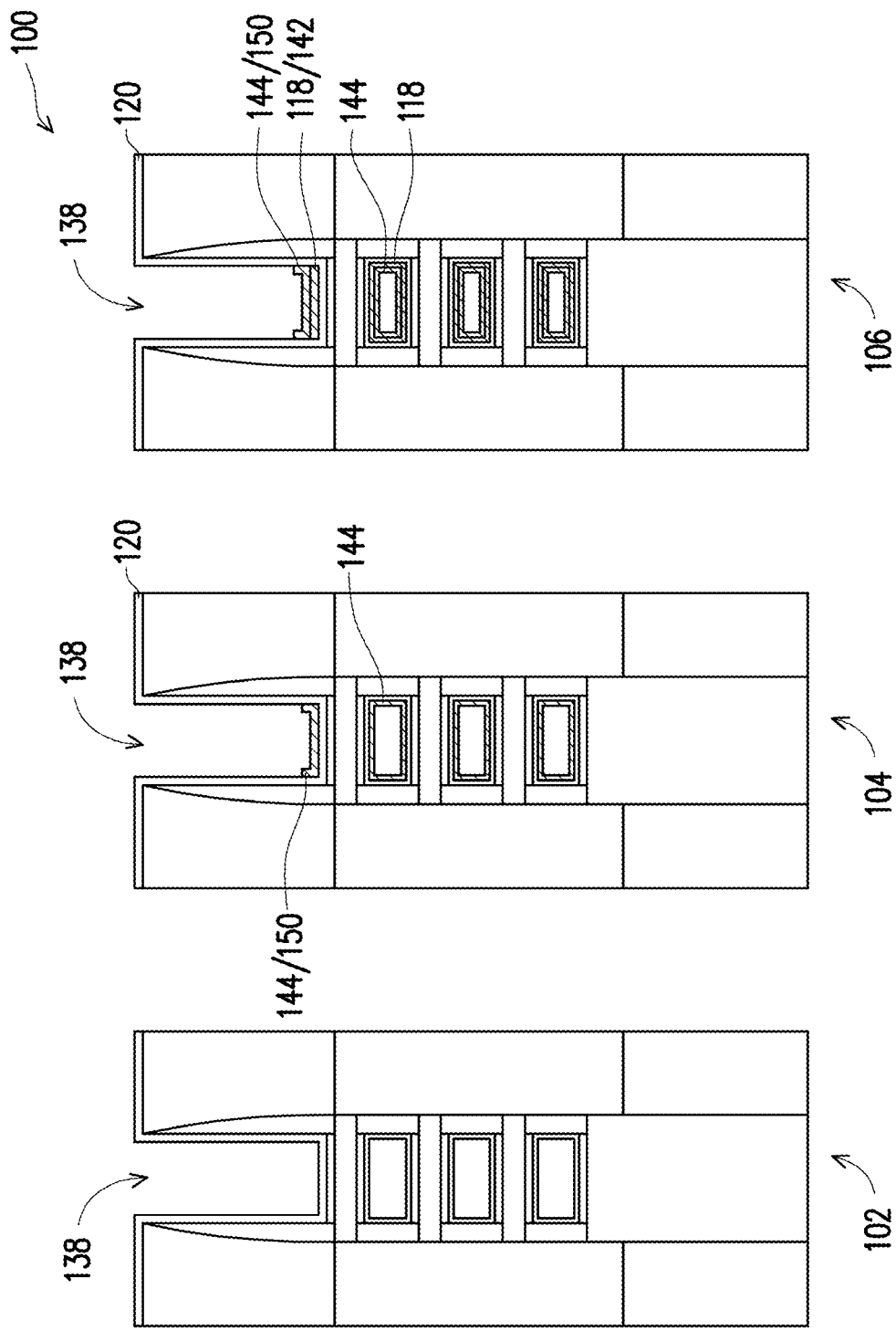

In FIG. 1I, the second gate metal 144 has been etched back within the trenches 138 of the transistor 104 and the transistor 106. The second gate metal 144 has not been entirely removed from the trenches 138 of the transistor 104 and the transistor 106. Instead, the second gate metal 144 has been etched back with a controlled etch that is selected to leave a remaining portion 150 of the second gate metal 144 at the bottom of the trenches of the transistor 104 and the transistor 106. In the transistor 104, the remaining portion 150 of the second gate metal 144 is positioned on the high-K dielectric layer 120 at the bottom of the trench 138. In the transistor 106, the remaining portion 150 of the second gate metal 144 is positioned on the remaining portion 142 of the first gate metal 118. The remaining portion 150 may extend vertically on a portion high-K dielectric layer 120 in the trenches 138 in the transistor 104 and the transistor 106.

The controlled etch that etches back the second gate metal 144 is the same type of controlled etch as the process that etches back the first gate metal 118 as described in relation to FIG. 1E in particular, an ALE process with dynamically controllable characteristics can be utilized to etch back the second gate metal 144. The controlled etch can be controlled by an analysis model of a control system. The analysis model can be trained with a machine learning process to select the parameters of the ALE process based on the desired characteristics of the remaining portion 150 of the second gate metal 144.

Figure 1J:
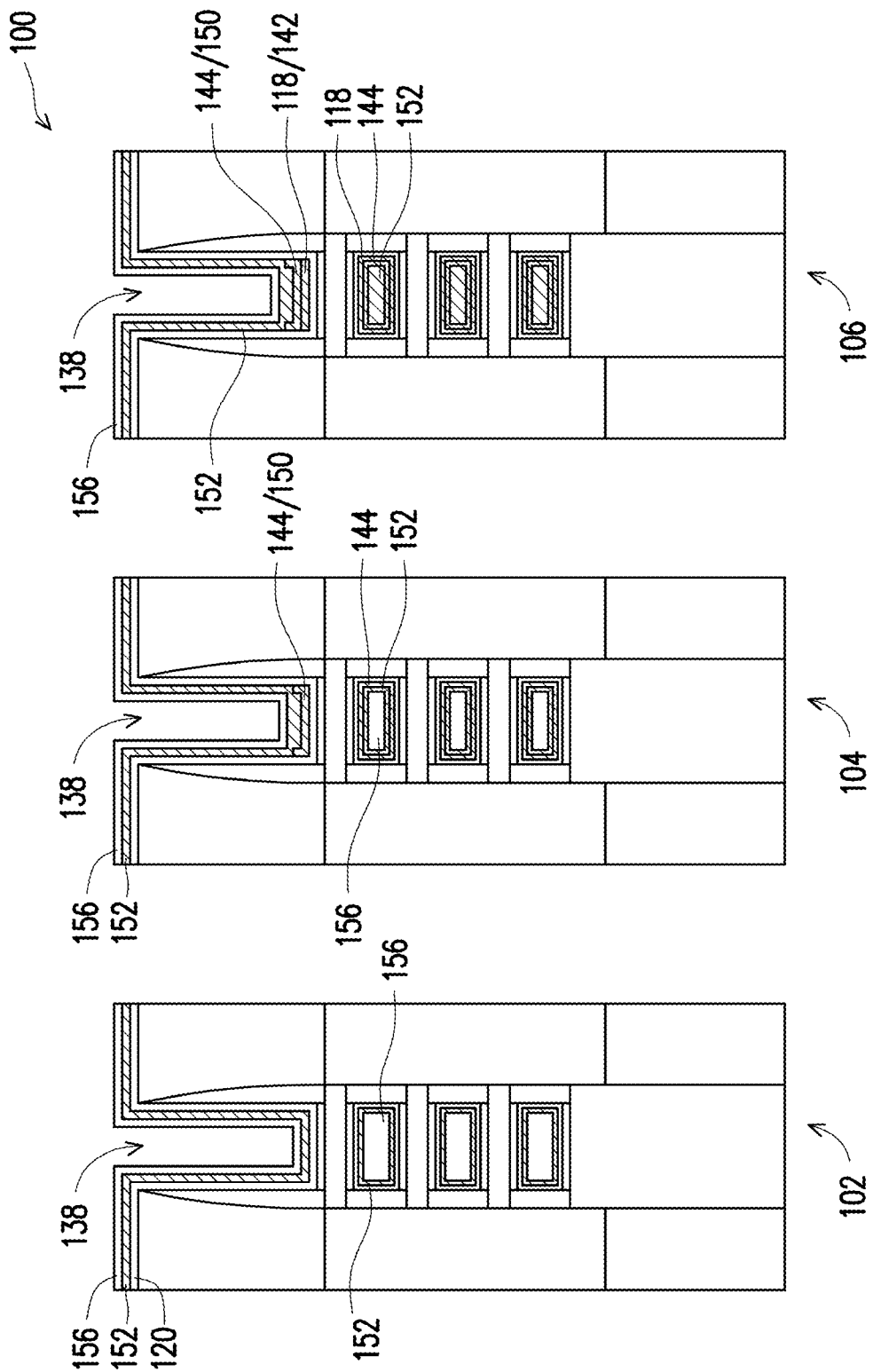

In FIG. 1J a third gate metal 152 has been deposited on the high-K dielectric layer 120 in the trenches of the transistor 102, the transistor 104, and the transistor 106. The third gate metal 152 is positioned on the remaining portions 150 of the second gate metal 144 in the trenches 138 of the transistor 104 and the transistor 106. The third gate metal 152 is positioned in the voids 116 of the gate structures 114 of the transistor 102, the transistor 104, and the transistor 106.

The third gate metal 152 can be deposited by a PVD process, a CVD process, or an ALD process. In one example, the third gate metal 152 includes titanium nitride. Alternatively, the third gate metal 152 can include one or more of include TaN, WN, and MoN or other suitable materials. The third gate metal 152 can have a thickness between 1 nm and 5 nm. Other materials, deposition processes, and thicknesses can be utilized for the third gate metal 152 without departing from the scope of the present disclosure.

In FIG. 1J, a silicon layer 156 has been formed on the third gate metal 152. In one example, the silicon layer 156 is deposited by a CVD process. In particular, an in-situ silane passivation layer can be deposited by a chemical vapor deposition process. After or during deposition of the silane passivation layer, a thermal annealing process or other types of heat treatment can be performed to raise the temperature of the silane between 420° C. and 500° C. At this elevated temperature, silane breaks down into silicon and hydrogen. The hydrogen gas is removed via ventilation and the silicon layer 156 remains. Other processes can be utilized performing the silicon layer 156 without departing from the scope of the present disclosure. The silicon layer 156 is formed on the third gate metal 152 in the trenches 138 of the transistor 102, the transistor 104, and the transistor 106. The silicon layer 156 is also present in the gate structures 114 of the transistor 102. In the example FIG. 1J, the silicon layer 156 is not present in the gate structures 114 of the transistor 104 and the transistor 106 because the voids 116 have been entirely filled by previously deposited layers. However, it is possible that the silicon layer 156 can be present in the gate structures 114 of the transistor 104 and the transistor 106 depending on the size of the voids 116 and a thickness of previously deposited layers. Furthermore, the silicon layer 156 may not entirely fill the remaining voids 116 of the gate structures 114 of the transistor 102.

In FIG. 1K a titanium layer has been deposited on the silicon layer 156. The titanium layer can be deposited by CVD or by another suitable process. The titanium layer 157 can have a thickness between 0.5 nm and 5 nm. After or during deposition of the titanium layer 157, a thermal annealing process, or another thermal treatment can be performed in order to heat the titanium layer 157 and the silicon layer 156. This results in a layer of titanium silicide 159 formed from the silicon layer 156 and the titanium layer 157. In one embodiment, the entirety of the silicon layer 156 and the titanium layer 157 may become silicide. Alternatively, the silicide 159 may form at an interface between the silicon layer 156 and the titanium layer 157, leaving a portion of pure silicon below the silicide and/or pure titanium above the silicide. Other processes and thicknesses can be utilized for forming the titanium layer 157 and the silicide without departing from the scope of the present disclosure.

One advantage to depositing titanium without depositing aluminum is that some conventional processing steps can be avoided. For example, when aluminum is deposited, typically a protection layer is also deposited to prevent oxidation of the aluminum. However, because there is no aluminum, in one example, the formation of a protection layer can be omitted. Other types of silicide can be used for the silicide 159. For example, the silicide 159 can include TaSi, CoSi, NiSi, WSi, MoSi, and CuSi. The silicide 159 can also include Ge in some embodiments.

Figure 1L:
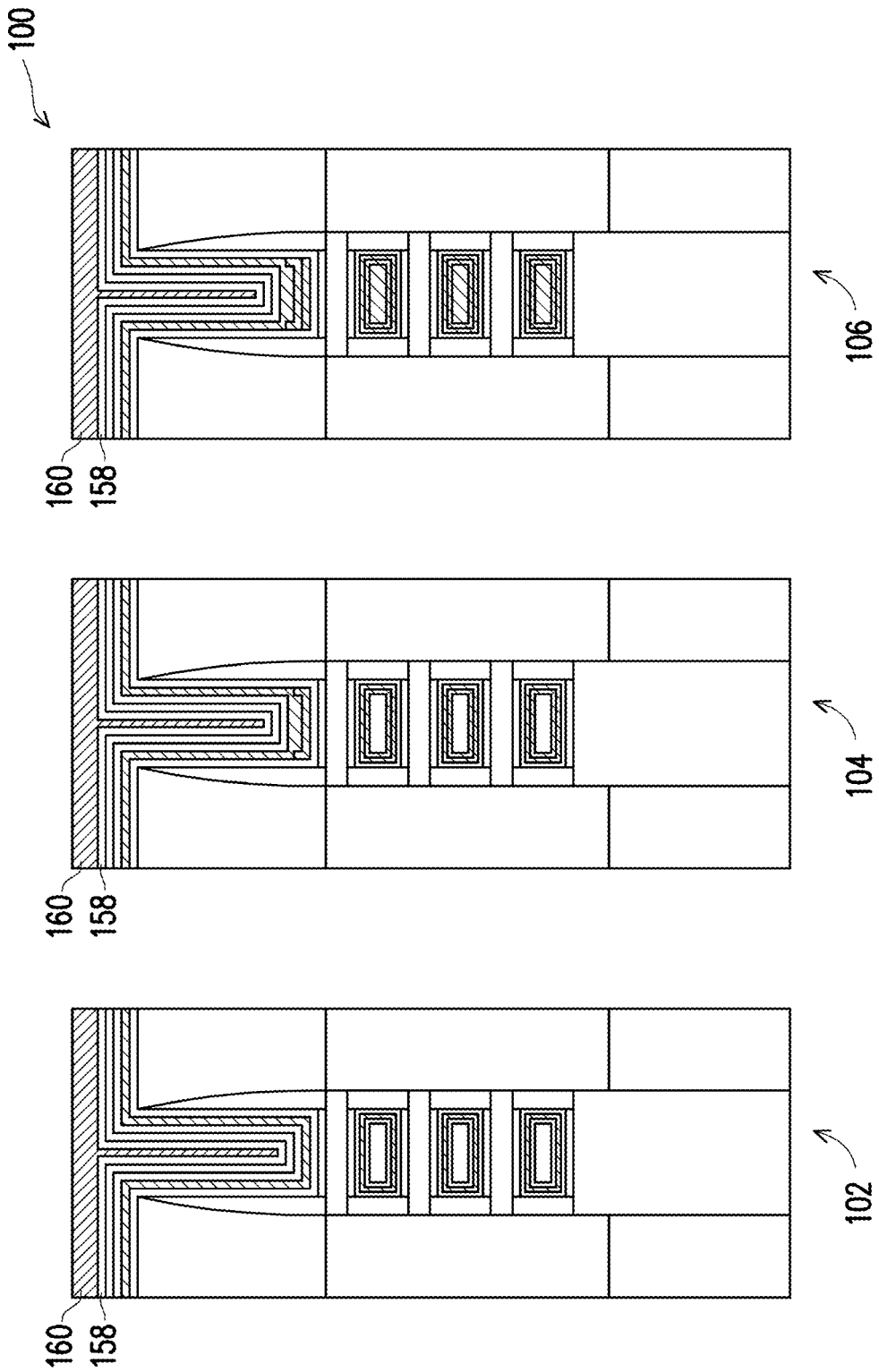

In FIG. 1L, a glue layer 158 has been formed on the titanium layer 157, or on the silicide 159 resulting from the titanium layer 157 if the entire titanium layer 157 becomes silicide. The glue layer 158 is also deposited in the trenches 138 of the transistor 102, the transistor 104, and the transistor 106. The glue layer 158 can include one or more of TiN, TaN, MoN, or WN. The glue layer 158 can be formed by an ALD process and can have a thickness between 0.5 nm and 5 nm. Other materials, processes, and thicknesses can be used for the glue layer 158 without departing from the scope of the present disclosure.

In FIG. 1L a fourth gate metal layer 160 has been deposited on the titanium nitride glue layer 158 in the trenches 138 of the transistor 102, the transistor 104, and the transistor 106. The fourth gate metal layer 160 fills the remaining portion of the trenches 138. In practice, the fourth gate metal layer 160 may fill a much larger portion of the trenches 138 than shown in FIG. 1L. The fourth gate metal 160 is a conductive gate fill material. While FIG. 1L illustrates the fourth gate metal layer 160 filling a relatively small portion of the trench 138, in practice the fourth gate metal 160 may fill a large majority of the trench 138. The thicknesses of the other layers in the trenches 138 may be very small compared to the widths of the trenches 138, though this is difficult to illustrate when showing a large number of distinct layers. Accordingly, the fourth gate metal layer 160 may fill up a large portion of the volume of the trenches 138. The fourth gate metal layer 160 can be termed a gate fill material or a metal plug for the trenches 138.

In one embodiment, the fourth gate metal layer 160 is tungsten deposited by a CVD process. Alternatively, the fourth gate metal layer can include one or more of Co, Ru, Ir, Mo, Cu or another low resistivity metal. The fourth gate metal layer 160 can be formed by a PVD process, an ALD process, or by other deposition processes. Other materials and processes can be utilized for the fourth gate metal 160 without departing from the scope of the present disclosure.

Figure 1M:
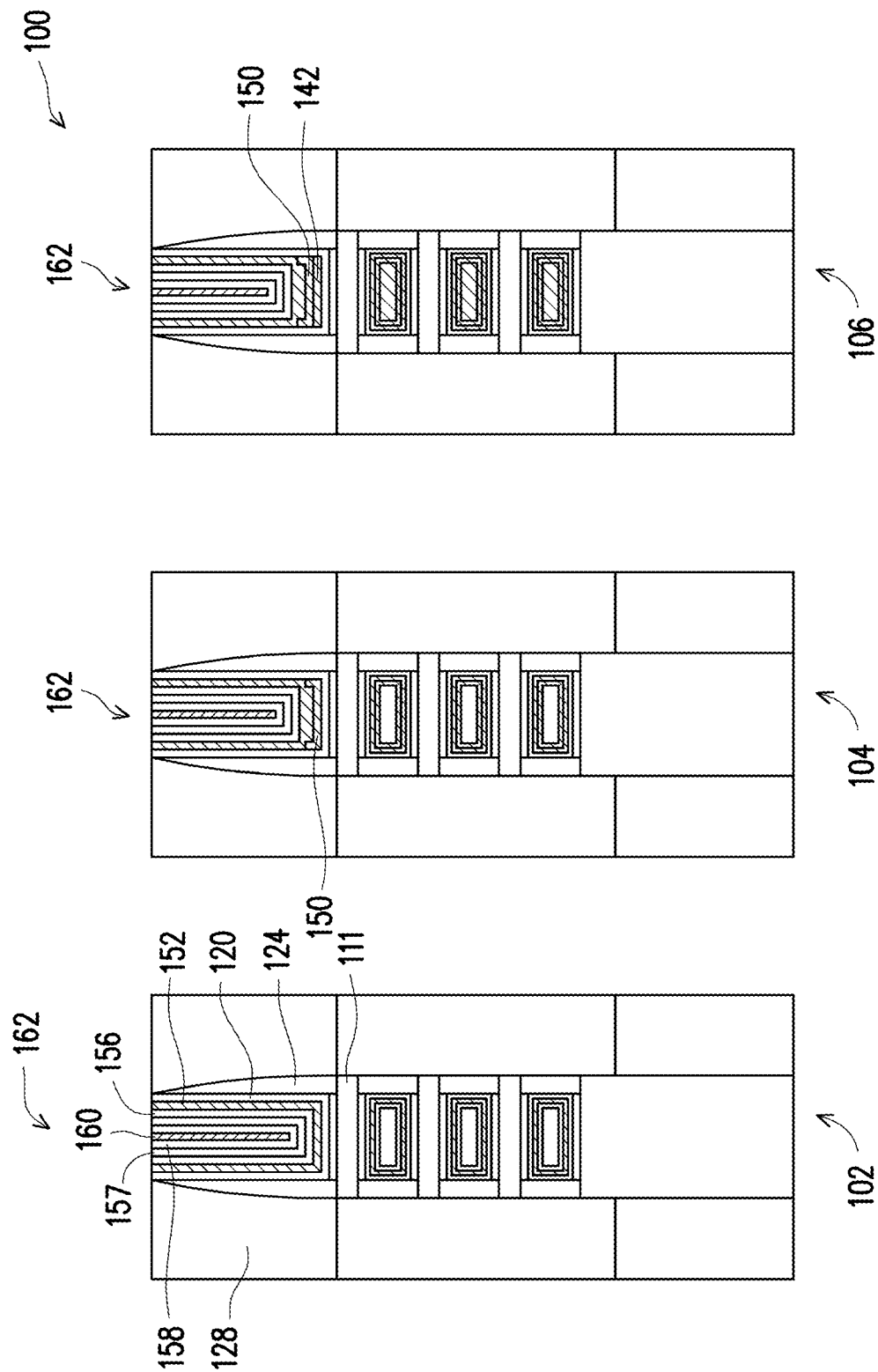
Figure 10:
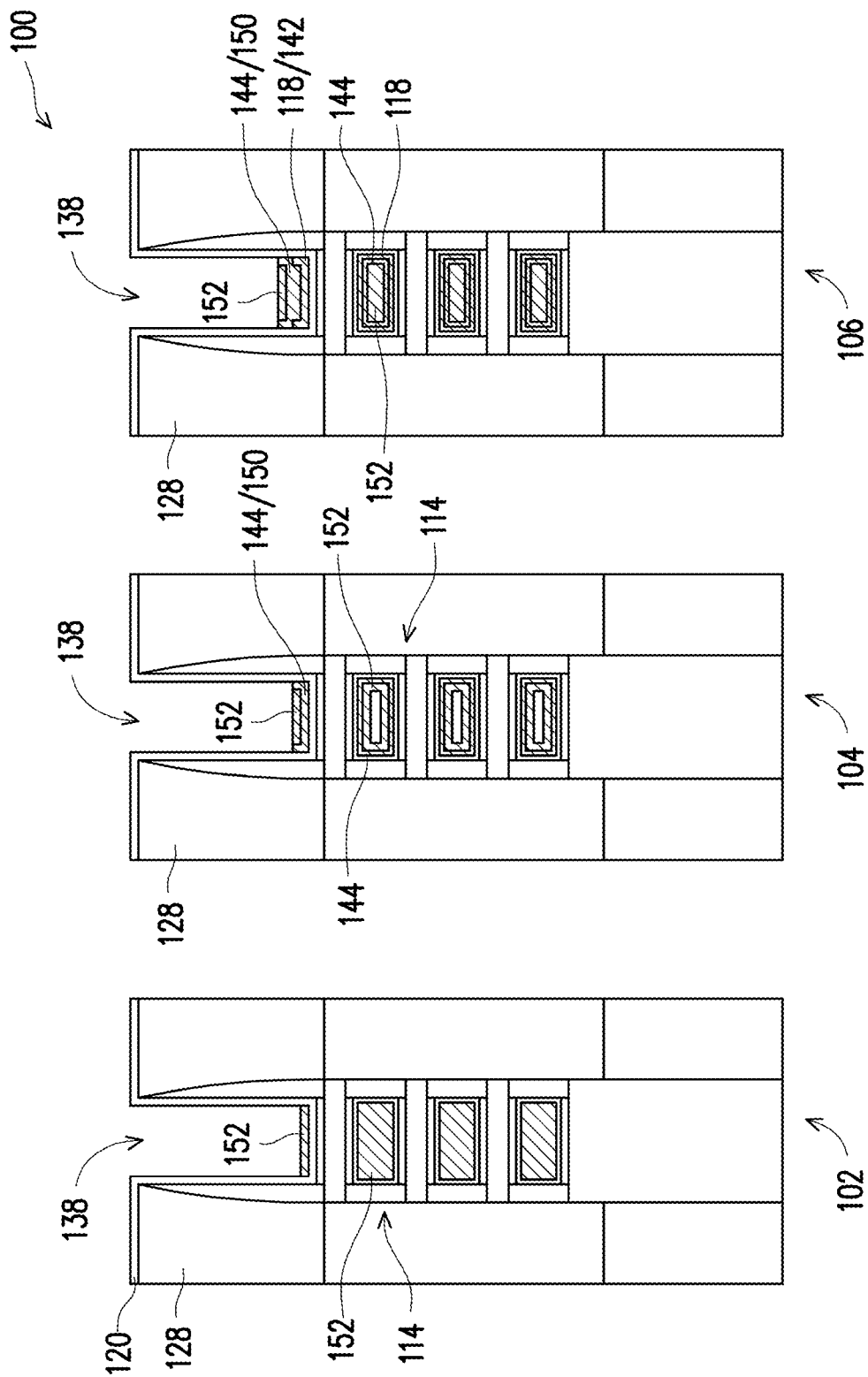

In FIG. 1M, a chemical mechanical planarization (CMP) process has been performed. The CMP process removes the high-K dielectric material 120, the third gate metal 152, the silicon layer 156, the titanium nitride layer 158, and the fourth gate metal 160 outside of the trenches 138. The CMP process also removes portions of the first sidewall spacers 134 and the interlayer dielectric layer 128.

The remaining portions of the third gate metal 152, the silicon layer 156, the titanium nitride layer 158, and the fourth gate metal 160 correspond to the gate electrode 162 of the transistor 102, the transistor 104, and the transistor 106. The gate electrode 162 of the transistor 104 also includes the remaining portion 150 of the second gate metal 144. The gate electrode 162 of the transistor 106 includes the remaining portion 142 of the first gate metal 118 and the remaining portion 150 of the second gate metal 144.

The conductive layers in the gate structures 114 are part of the gate electrodes 162. The gate electrodes 162 surround the semiconductor nanosheets 111 and can render the channel regions corresponding to the semiconductor nanosheets 111 conductive or nonconductive by application of voltages to the gate electrodes.

The presence of the remaining portion 150 of the second gate metal 144 and the gate electrode 162 of the transistor 104 results in the transistor 104 having a higher threshold voltage than the threshold voltage of the transistor 102. The presence of the remaining portion 142 of the first gate metal 118 and the remaining portion 150 of the second gate metal 144 in the transistor 106 results in the transistor 106 having a higher threshold voltage than the transistor 104. This can be accomplished due to the controlled etching process that etches back the first gate metal 118 without entirely removing the first gate metal 118 from the trench 138 of the transistor 106, and due to the controlled etching process that etches back the second gate metal 144 without entirely removing the second gate metal 144 from the trenches 138 of the transistor 104 and the transistor 106.

Due to the controlled etching processes that define the remaining portions 142 and 150 of the first and second gate metals 118 and 144, the fourth gate metal 160 extends to a higher vertical level within the trench 138 than do the remaining portions 142 and 150 of the first and second gate metals 118 and 144 in the trench 138 of the transistor 106. The fourth gate metal 160 extends to the top of the trench 138. Similarly, the fourth gate metal 160 extends to a higher vertical level within the trench 138 of the transistor 104 than does the remaining portion 150 of the second gate metal 144. This may be one characteristic of the controlled etching processes that enable the formation of transistors having different threshold voltages.

The presence of the remaining portions 142 and 150 of the first and second gate metals in the transistor 106 results in the bottom of the fourth gate metal 160 being farther from the bottom of the trench 138 of the transistor 104 than the fourth gate metal 160 of the transistor 104 is from the bottom of the trench 138 of the transistor 104. This contributes to the higher threshold voltage of the transistor 106. Part of the reason for this is that the first and second gate metals 118, 144 have a higher work function than the fourth gate metal 160.

The presence of the remaining portion 150 of the second gate metal in the transistor 104 results in the bottom of the fourth gate metal 160 being farther from the bottom of the trench 138 of the transistor 104 than the fourth gate metal 160 of the transistor 102 is from the bottom of the trench 138 of the transistor 102. This contributes to the higher threshold voltage of the transistor 106 due, in part, to the second gate metal 144 having a higher work function than the fourth gate metal 160.

In FIG. 1N, silicide layers 166 have been formed in the source and drain regions 112 of each of the transistors 102, 104, and 106. The silicide layers 166 can include titanium silicide, cobalt silicide, or other types of silicide. In FIG. 1M, cobalt contact plugs 168 have been formed in the interlayer dielectric layer 128 in each of the transistors 102, 104, and 106. The cobalt contact plugs 168 can be utilized to apply voltages to the source and drain regions 112 of the transistors 102, 104, and 106. The plugs 168 are surrounded by a titanium nitride glue layer 167. The plugs 168, the glue layer 167, and the silicide layers 166 can include other materials without departing from the scope of the present disclosure.

FIGS. 1A-1N describe the formation of N-channel transistors. A P-channel ultra-low threshold voltage transistor, a P-channel low threshold voltage transistor, and a P-channel standard threshold voltage transistor can be formed during the same process. One difference is that in the regions of the integrated circuit 100 where P-channel transistors will be formed, the semiconductor materials will be doped differently. For example, the source and drain regions 112 of P-channel transistors will be doped with P-type dopants. The semiconductor substrate 110 and the semiconductor nanosheets 111 may also be doped in accordance with the process for doping P-channel transistors. For P-channel transistors, the mask 140 shown in FIG. 1B will fill the trench associated with the ultra-low threshold voltage P-channel transistor, eventually resulting in the remaining portion 142 of the first gate metal 118 being found in the trench 138 of the ultra-low threshold voltage P-channel transistors while the first gate metal 118 will be entirely removed from the low threshold voltage and standard threshold voltage P-channel transistors. For P-channel transistors, the mask 146 shown in FIG. 1G will fill the trenches 138 associated with the ultra-low threshold voltage P-channel transistor and the low-voltage P-channel transistor, eventually resulting in the remaining portion 150 of the second gate metal 144 been found in the trenches 138 of the ultra-low threshold voltage P-channel transistor and the low-voltage P-channel transistors. Accordingly, the process shown in FIGS. 1A-1N will simultaneously form ultra-low-voltage, low-voltage, and standard threshold voltage N-channel transistors and P-channel transistors, according to one embodiment.

Figure 1Q:
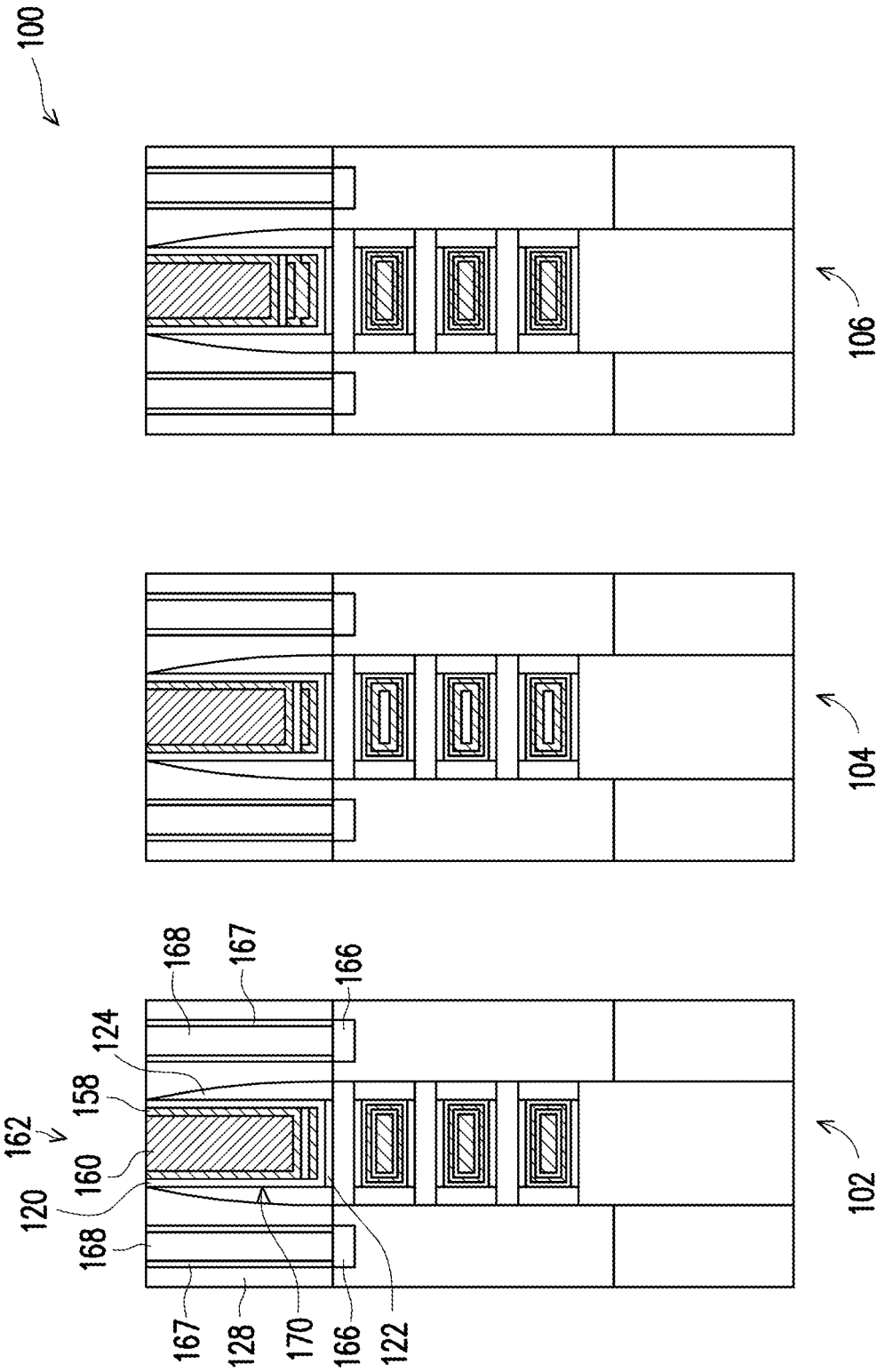

FIGS. 1O-1Q illustrate an alternative embodiment for forming the integrated circuit 100. The structure shown in FIG. 1O begins from the structure shown in FIG. 1I. The third gate metal 152 is deposited on the high K dielectric layer 120 on top of the interlevel dielectric layer 128 and in the trenches 138 of the transistors 102, 104, and 106. After the third gate metal 152 has been deposited, a controlled ALE process is performed to etch the third gate metal 152. The ALE process that etches the third gate metal 152 from the high K dielectric layer 120 on top of the interlevel dielectric layer 128 and on the sidewalls of the trench 138 in each of the transistors 102, 104, and 106. The parameters of the ALE process are selected to ensure that a portion of the third gate metal 152 remains on the bottom of the trenches 138. In particular, a portion of the third gate metal 152 remains on the high K dielectric layer 120 at the bottom of the trench 138 of the transistor 102. A portion of the third gate metal 152 remains on the remaining portion 150 of the second gate metal 144 at the bottom of the trenches of the transistor 104 and the transistor 106.

One reason for performing the controlled ALE etch is to reduce the amount of material on the sidewalls of the trenches 138 before deposition of the fourth gate metal 160. The result is that a larger volume of the trenches 138 can be filled with the highly conductive fourth gate metal 160.

In FIG. 1N, a layer of silicide 159 has been formed on the third gate metal 152 in the trenches 138 of the transistors 102, 104, and 106. The layer silicide 159 can include titanium silicide formed from a silicon layer 156 and a titanium layer 157 as described previously in relation to FIG. 1K. When initially formed, the silicide 159 may cover the gate dielectric 120 on the sidewalls of the trench 138 and on top of the interlevel dielectric layer 128. The silicide 159 is a patterned using a controlled ALE process as described previously. The parameters of the ALE process are selected by an analysis model trained with a machine learning process. The parameters are selected to ensure that the silicide 159 is removed from the sidewalls of the trench 138 and from on top of the interlevel dielectric layer 128 while leaving a remaining portion of silicide 159 at the bottom of the trench 138 on the third gate metal 152. As set forth previously, this can enable a larger volume of the trenches 138 to be filled with the fourth gate metal 160.

In FIG. 1Q the titanium nitride glue layer 158 and the fourth gate metal 160 have been deposited in the trenches 138 of the transistors 102, 104, and 106 as described previously in relation to FIG. 1L. A CMP process has been performed as described previously in relation to FIG. 1M. Source and drain silicide 166, glue layer 167, and source and drain contact plugs 168 have been formed as described in relation to FIG. 1N. As can be seen in FIG. 1Q, the fourth gate metal 160 fills a larger volume of the trenches 138 than in the embodiment of FIG. 1N due to the fact that fewer layers are positioned on the sidewalls of the trenches 138 than in FIG. 1N.

Though not shown in FIGS. 1A-1Q, the dielectric layer 120 can be removed from the sidewalls 170 of the trenches 138 of the transistors 102, 104, and 106 prior to the structure shown in FIG. 1A. In this case, the sidewalls 170 of the trench 138 correspond to the sidewalls of the sidewall spacers 124. In particular, the dielectric layer 120 will remain only at the bottom of the trench 138 on top of the dielectric layer 122. This can be accomplished by utilizing a controlled ALE process as described previously and as will be described in further detail in relation to FIGS. 2A-5. Patterning the dielectric layer 120 in this manner results in a greater volume of the trench 138 being filled by the fourth gate metal 160.

Figure 2A:
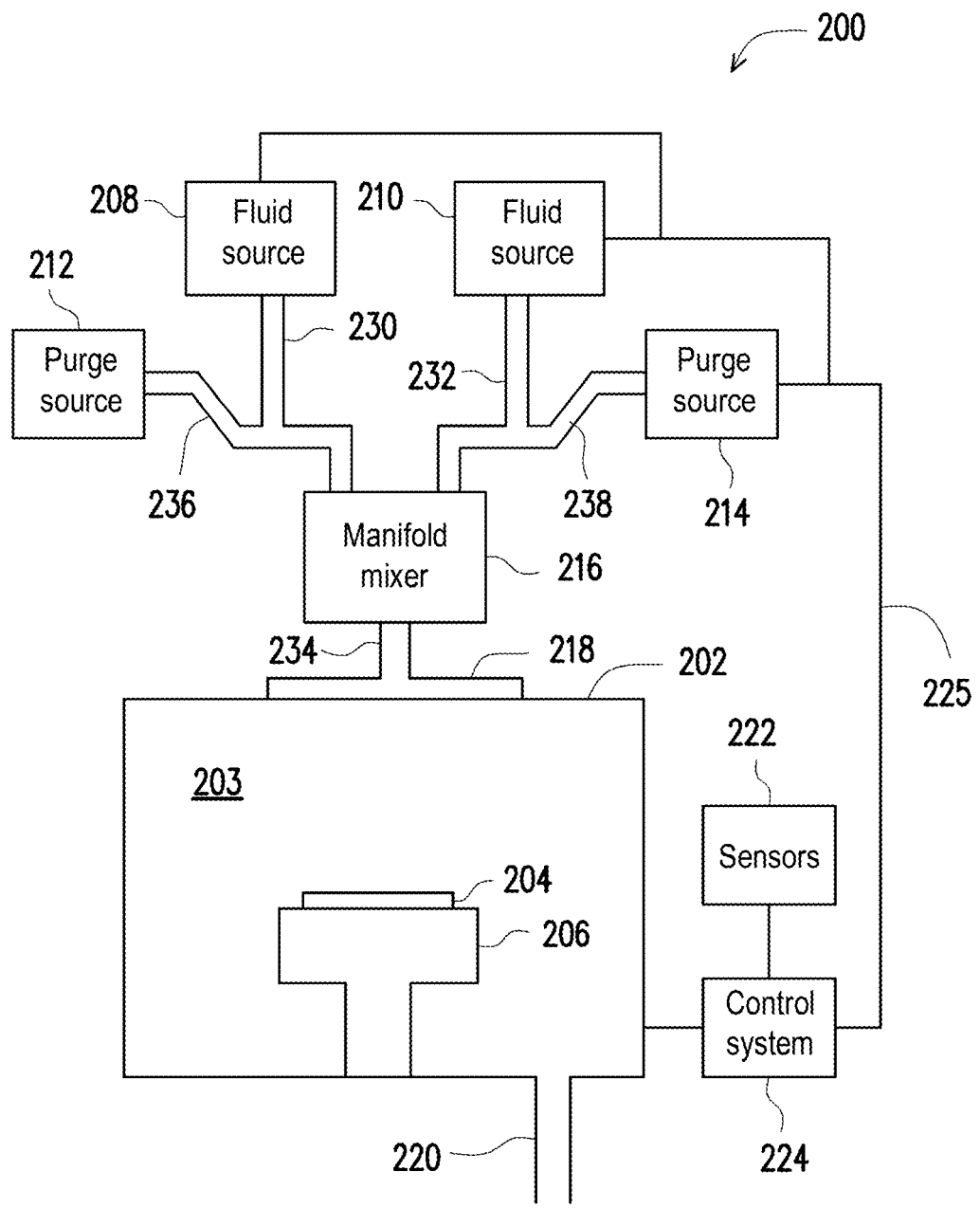
FIG. 2A is an illustration of a semiconductor process system, according to one embodiment.

FIG. 2A is an illustration of a semiconductor process system 200, according to one embodiment. The semiconductor process system 200 can be utilized to perform the controlled ALE processes used to form the integrated circuit 100 as described in relation to FIGS. 1A-1Q. The semiconductor process system 200 includes a process chamber 202 including an interior volume 203. A support 206 is positioned within the interior volume 203 and is configured to support a substrate 204 during a thin-film etching process. The semiconductor process system 200 is configured to etch a thin film on the substrate 204. The semiconductor process system 200 includes a control system 224 that dynamically adjusts thin-film etching parameters. Details of the control system 224 are provided after description of the operation of the semiconductor process system 200.

In one embodiment, the semiconductor process system 200 includes a first fluid source 208 and a second fluid source 210. The first fluid source 208 supplies a first fluid into the interior volume 203. The second fluid source 210 supplies a second fluid into the interior volume 203. The first and second fluids both contribute in etching a thin film on the substrate 204. While FIG. 2A illustrates fluid sources 208 and 210, in practice, the fluid sources 208 and 210 may include or supply materials other than fluids. For example, the fluid sources 208 and 210 may include material sources that provide all materials for the etching process.

In one embodiment, the semiconductor process system 200 is an atomic layer etching (ALE) system that performs ALE processes. The ALE system performs etching processes in cycles. Each cycle includes flowing a first etching fluid from the fluid source 208, followed by purging the first etching fluid from the etching chamber by flowing the purge gas from one or both of the purge sources 212 and 224, followed by flowing a second etching fluid from the fluid source 210, followed by purging the second etching fluid from the etching chamber by flowing the purge gas from one or both of the purge sources 212 and 224. This corresponds to a single ALE cycle. Each cycle etches an atomic or molecular layer from the thin-film that is being etched.

The parameters of a thin film generated by the semiconductor process system 200 can be affected by large number of process conditions. The process conditions can include, but are not limited to, an amount of fluid or material remaining in the fluid sources 208, 210, a flow rate of fluid or material from the fluid sources 208, 210, the pressure of fluids provided by the fluid sources 208 and 210, the length of tubes or conduits that carry fluid or material into the process chamber 202, the age of an ampoule defining or included in the process chamber 202, the temperature within the process chamber 202, the humidity within the process chamber 202, the pressure within the process chamber 202, light absorption a reflection within the process chamber 202, surface features of the semiconductor wafer 204, the composition of materials provided by the fluid sources 208 and 210, the phase of materials provided by the fluid sources 208 and 210, the duration of the etching process, the duration of individual phases of the etching process, and various other factors, including factors not specifically listed above.

The combination of the various process conditions during the etching process determines the remaining thickness a thin film etched by the ALE process. It is possible that process conditions may result in thin films that do not have remaining thicknesses that fall within target parameters. If this happens, then integrated circuits formed from the semiconductor wafer 204 may not function properly. The quality of batches of semiconductor wafers may suffer. In some cases, some semiconductor wafers may need to be scrapped.

The semiconductor process system 200 utilizes the control system 224 to dynamically adjust process conditions to ensure that etching processes result in thin films having parameters or characteristics that fall within target parameters or characteristics. The control system 224 is connected to processing equipment associated with the semiconductor process system 200. The processing equipment can include components shown in FIG. 2A. The control system 224 can control the flow rate of material from the fluid sources 208 and 210, the temperature of materials supplied by the fluid sources 208 and 210, the pressure of fluids provided by the fluid sources 208 and 210, the flow rate of material from purge sources 212 and 214, the duration of flow of materials from the fluid sources 208 and 210 and the purge sources 212 and 214, the temperature within the process chamber 202, the pressure within the process chamber 202, the humidity within the process chamber 202, and other aspects of the thin-film etching process. The control system 224 controls these process parameters so that the thin-film etching process results in a thin-film having target parameters such as a target remaining thickness, a target composition, a target crystal orientation, etc. Further details regarding the control system are provided in relation to FIGS. 7-9.

In one embodiment, the control system 224 is communicatively coupled to the first and second fluid sources 208, 210 via one or more communication channels 225. The control system 224 can send signals to the first fluid source 208 and the second fluid source 210 via the communication channels 225. The control system 224 can control functionality of the first and second fluid sources 208, 210 responsive, in part, to the sensor signals from the byproduct sensor 222.

In one embodiment, the semiconductor process system 200 can include one or more valves, pumps, or other flow control mechanisms for controlling the flow rate of the first fluid from the first fluid source 208. These flow control mechanisms may be part of the fluid source 208 or may be separate from the fluid source 208. The control system 224 can be communicatively coupled to these flow control mechanisms or to systems that control these flow control mechanisms. The control system 224 can control the flowrate of the first fluid by controlling these mechanisms. The control system 200 may include valves, pumps, or other flow control mechanisms that control the flow of the second fluid from the second fluid source 210 in the same manner as described above in reference to the first fluid and the first fluid source 208.

In one embodiment, the semiconductor process system 200 includes a manifold mixer 216 and a fluid distributor 218. The manifold mixer 216 receives the first and second fluids, either together or separately, from the first fluid source 208 and the second fluid source 210. The manifold mixer 216 provides either the first fluid, the second fluid, or a mixture of the first and second fluids to the fluid distributor 218. The fluid distributor 218 receives one or more fluids from the manifold mixer 216 and distributes the one or more fluids into the interior volume 203 of the process chamber 202.

In one embodiment, the first fluid source 208 is coupled to the manifold mixer 216 by a first fluid channel 230. The first fluid channel 230 carries the first fluid from the fluid source 208 to the manifold mixer 216. The first fluid channel 230 can be a tube, pipe, or other suitable channel for passing the first fluid from the first fluid source 208 to the manifold mixer 216. The second fluid source 210 is coupled to the manifold mixer 216 by second fluid channel 232. The second fluid channel 232 carries the second fluid from the second fluid source 210 to the manifold mixer 216.

In one embodiment, the manifold mixer 216 is coupled to the fluid distributor 218 by a third fluid line 234. The third fluid line 234 carries fluid from the manifold mixer 216 to the fluid distributor 218. The third fluid line 234 may carry the first fluid, the second fluid, a mixture of the first and second fluids, or other fluids, as will be described in more detail below.

The first and second fluid sources 208, 210 can include fluid tanks. The fluid tanks can store the first and second fluids. The fluid tanks can selectively output the first and second fluids.

In one embodiment, the semiconductor process system 200 includes a first purge source 212 and the second purge source 214. The first purge source is coupled to the first fluid line 230 by first purge line 236. The second purge source is coupled to the fluid line 232 by second purge line 238. In practice, the first and second purge sources may be a single purge source.

In one embodiment, the first and second purge sources 212, 214 supply a purging gas into the interior volume 203 of the process chamber 202. The purge fluid is a fluid selected to purge or carry the first fluid, the second fluid, byproducts of the first or second fluid, or other fluids from the interior volume 203 of the process chamber 202. The purge fluid is selected to not react with the substrate 204, the gate metal layer on the substrate 204, the first and second fluids, and byproducts of this first or second fluid. Accordingly, the purge fluid may be an inert gas including, but not limited to, Ar or N2.

While FIG. 2A illustrates a first fluid source 208 and a second fluid source 210, in practice the semiconductor process system 200 can include other numbers of fluid sources. For example, the semiconductor process system 200 may include only a single fluid source or more than two fluid sources. Accordingly, the semiconductor process system 200 can include a different number than two fluid sources without departing from the scope of the present disclosure.

Figure 2B:
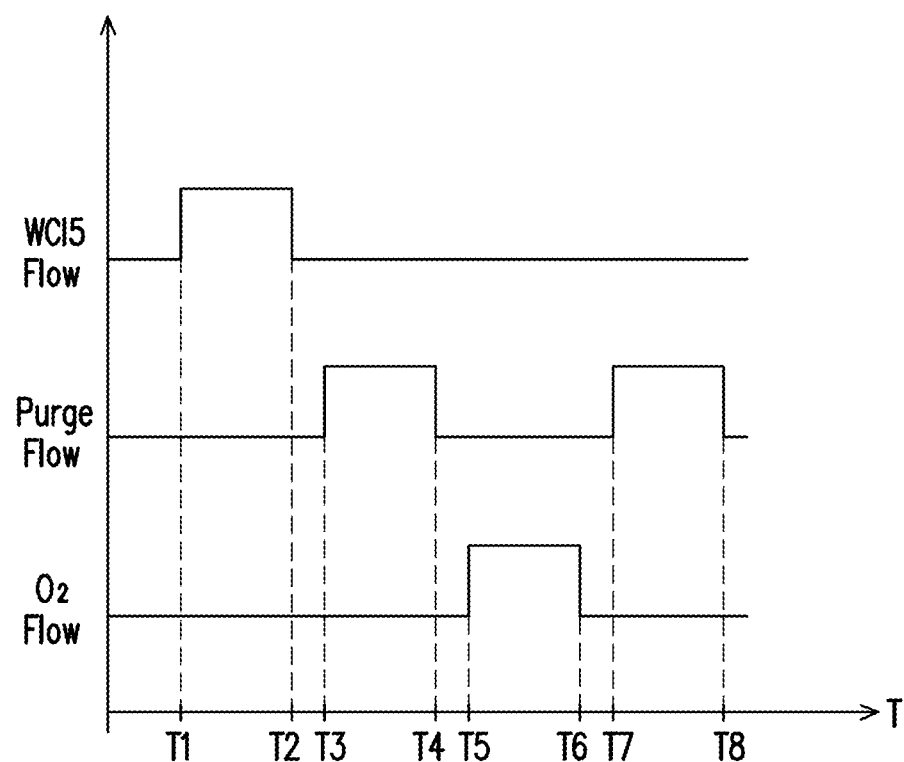
FIG. 2B is a graph illustrating fluid flow during a cycle of an atomic layer etching process.

FIG. 2B is a graph illustrating a cycle of an ALE process performed by the semiconductor process system 200, according to one embodiment. At time T1 the first etching fluid begins to flow. In the example of FIG. 2B, the first etching fluid is WCl5. The first etching fluid flows from the fluid source 208 into the interior volume 203. In the interior volume 203, the first etching fluid reacts with the top expose layer of the titanium nitride layer 124. At time T2, the first etching fluid WCl5 stops flowing. In one example, the time elapsed between T1 and T2 between 1 s and 10 s.

At time T3, the purge gas begins to flow. The purge gas flows from one or both of the purge sources 212 and 224. In one example, the purge gas is one of argon, N2, or another inert gas that can purge the first etching fluid WCl5 without reacting with the titanium nitride layer 124. At time T4, the purge gas stops flowing. In one example, the time elapsed between T3 and T4 is between 2 s and 15 s.

At time T5, the second etching fluid flows into the interior volume 203. The second etching fluid flows from the fluid source 210 into the interior volume 203. In one example, the second etching fluid is $O_2$. The $O_2$ reacts with the top atomic or molecular layer of the titanium nitride layer 124 and completes the etching of the top atomic or molecular layer of the titanium nitride layer 124. At time T6, the second etching fluid stops flowing. In one example, the elapsed time between T5 and T6 is between 1 s and 10 s.

At time T7, the purge gas flows again and purges the interior volume 203 of the second etching fluid. At time T8 the purge gas stops flowing. The time between T1 and T8 corresponds to a single ALE cycle.

In practice, an ALE process may include between 5 and 50 cycles, depending on the initial thickness of the titanium nitride layer and the desired final thickness of the titanium nitride layer. Each cycle removes an atomic or molecular layer of the titanium nitride layer 124. Other materials, processes, and elapsed times can be utilized without departing from the scope of the present disclosure.

Figure 3A:
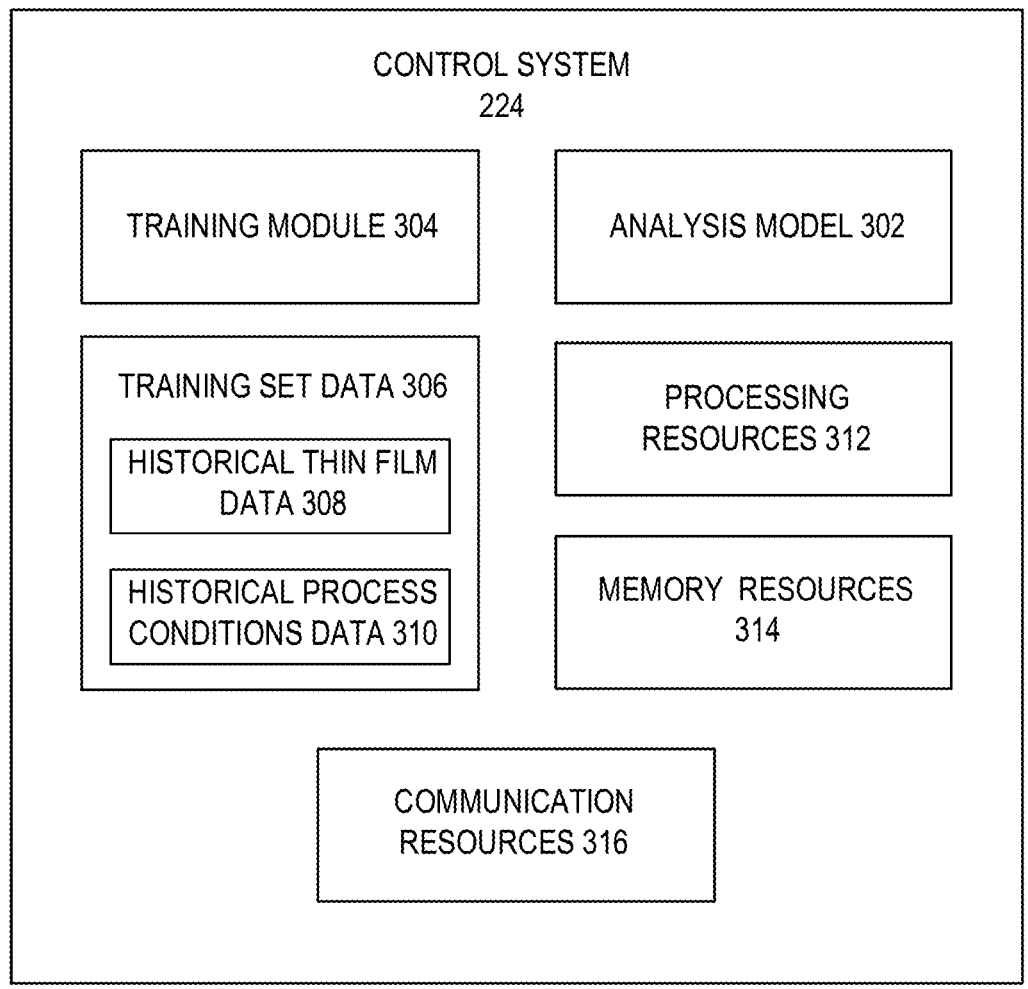
FIG. 3A is a block diagram of a control system of a semiconductor process system.

FIG. 3A is a block diagram of the control system 224 of FIG. 2A, according to one embodiment. The control system 224 of FIG. 3A is configured to control operation of the semiconductor process system 200 in performing ALE processes to form the integrated circuit 100 of FIGS. 1A-1Q, according to one embodiment. The control system 224 utilizes machine learning to adjust parameters of the semiconductor process system 200. The control system 224 can adjust parameters of the semiconductor process system 200 between ALE runs or even between ALE cycles in order to ensure that a thin-film layer formed by the ALE process falls within selected specifications.

In one embodiment, the control system 224 includes an analysis model 302 and a training module 304. The training module trains the analysis model 302 with a machine learning process. The machine learning process trains the analysis model 302 to select parameters for an ALE process that will result in a thin film having selected characteristics. Although the training module 304 is shown as being separate from the analysis model 302, in practice, the training module 304 may be part of the analysis model 302.

The control system 224 includes, or stores, training set data 306. The training set data 306 includes historical thin-film data 308 and historical process conditions data 310. The historical thin-film data 308 includes data related to thin films resulting from ALE processes. The historical process conditions data 310 includes data related to process conditions during the ALE processes that generated the thin films. As will be set forth in more detail below, the training module 304 utilizes the historical thin-film data 308 and the historical process conditions data 310 to train the analysis model 302 with a machine learning process.

In one embodiment, the historical thin-film data 308 includes data related to the remaining thickness of previously etched thin films. For example, during operation of a semiconductor fabrication facility, thousands or millions of semiconductor wafers may be processed over the course of several months or years. Each of the semiconductor wafers may include thin films etched by ALE processes. After each ALE process, the thicknesses of the thin-films are measured as part of a quality control process. The historical thin-film data 308 includes the remaining thicknesses of each of the thin films etched by ALE processes. Accordingly, the historical thin-film data 308 can include thickness data for a large number of thin-films etched by ALE processes.

In one embodiment, the historical thin-film data 308 may also include data related to the thickness of thin films at intermediate stages of the thin-film etching processes. For example, an ALE process may include a large number of etching cycles during which individual layers of the thin film are etched. The historical thin-film data 308 can include thickness data for thin films after individual etching cycles or groups of etching cycles. Thus, the historical thin-film data 308 not only includes data related to the total thickness of a thin film after completion of an ALE process, but may also include data related to the thickness of the thin film at various stages of the ALE process.

In one embodiment, the historical thin-film data 308 includes data related to the composition of the remaining thin films etched by ALE processes. After a thin film is etched, measurements can be made to determine the elemental or molecular composition of the thin films. Successful etching of the thin films results in a thin film that includes particular remaining thicknesses. Unsuccessful etching processes may result in a thin film that does not include the specified proportions of elements or compounds. The historical thin-film data 308 can include data from measurements indicating the elements or compounds that make up the various thin films.

In one embodiment, the historical process conditions 310 include various process conditions or parameters during ALE processes that etch the thin films associated with the historical thin-film data 308. Accordingly, for each thin film having data in the historical thin-film data 308, the historical process conditions data 310 can include the process conditions or parameters that were present during etching of the thin film. For example, the historical process conditions data 310 can include data related to the pressure, temperature, and fluid flow rates within the process chamber during ALE processes.

The historical process conditions data 310 can include data related to remaining amounts of precursor material in the fluid sources during ALE processes. The historical process conditions data 310 can include data related to the age of the process chamber 202, the number of etching processes that have been performed in the process chamber 202, a number of etching processes that have been performed in the process chamber 202 since the most recent cleaning cycle of the process chamber 202, or other data related to the process chamber 202. The historical process conditions data 310 can include data related to compounds or fluids introduced into the process chamber 202 during the etching process. The data related to the compounds can include types of compounds, phases of compounds (solid, gas, or liquid), mixtures of compounds, or other aspects related to compounds or fluids introduced into the process chamber 202. The historical process conditions data 310 can include data related to the humidity within the process chamber 202 during ALE processes. The historical process conditions data 310 can include data related to light absorption and light reflection related to the process chamber 202. The historical process conditions data 310 can include data related to the length of pipes, tubes, or conduits that carry compounds or fluids into the process chamber 202 during ALE processes. The historical process conditions data 310 can include data related to the condition of carrier gases that carry compounds or fluids into the process chamber 202 during ALE processes.

In one embodiment, historical process conditions data 310 can include process conditions for each of a plurality of individual cycles of a single ALE process. Accordingly, the historical process conditions data 310 can include process conditions data for a very large number of ALE cycles.

In one embodiment, the training set data 306 links the historical thin-film data 308 with the historical process conditions data 310. In other words, the thin-film thickness, material composition, or crystal structure associated with a thin film in the historical thin-film data 308 is linked to the process conditions data associated with that etching process. As will be set forth in more detail below, the labeled training set data can be utilized in a machine learning process to train the analysis model 302 to predict semiconductor process conditions that will result in properly formed thin films.

In one embodiment, the control system 324 includes processing resources 312, memory resources 314, and communication resources 316. The processing resources 312 can include one or more controllers or processors. The processing resources 312 are configured to execute software instructions, process data, make thin-film etching control decisions, perform signal processing, read data from memory, write data to memory, and to perform other processing operations. The processing resources 312 can include physical processing resources 312 located at a site or facility of the semiconductor process system 200. The processing resources can include virtual processing resources 312 remote from the site semiconductor process system 200 or a facility at which the semiconductor process system 200 is located. The processing resources 312 can include cloud-based processing resources including processors and servers accessed via one or more cloud computing platforms.

In one embodiment, the memory resources 314 can include one or more computer readable memories. The memory resources 314 are configured to store software instructions associated with the function of the control system and its components, including, but not limited to, the analysis model 302. The memory resources 314 can store data associated with the function of the control system 224 and its components. The data can include the training set data 306, current process conditions data, and any other data associated with the operation of the control system 224 or any of its components. The memory resources 314 can include physical memory resources located at the site or facility of the semiconductor process system 200. The memory resources can include virtual memory resources located remotely from site or facility of the semiconductor process system 200. The memory resources 314 can include cloud-based memory resources accessed via one or more cloud computing platforms.

In one embodiment, the communication resources can include resources that enable the control system 224 to communicate with equipment associated with the semiconductor process system 200. For example, the communication resources 316 can include wired and wireless communication resources that enable the control system 224 to receive the sensor data associated with the semiconductor process system 200 and to control equipment of the semiconductor process system 200. The communication resources 316 can enable the control system 224 to control the flow of fluids or other material from the fluid sources 308 and 310 and from the purge sources 312 and 314. The communication resources 316 can enable the control system 224 to control heaters, voltage sources, valves, exhaust channels, wafer transfer equipment, and any other equipment associated with the semiconductor process system 200. The communication resources 316 can enable the control system 224 to communicate with remote systems. The communication resources 316 can include, or can facilitate communication via, one or more networks such as wire networks, wireless networks, the Internet, or an intranet. The communication resources 316 can enable components of the control system 224 to communicate with each other.

In one embodiment, the analysis model 302 is implemented via the processing resources 312, the memory resources 314, and the communication resources 316. The control system 224 can be a dispersed control system with components and resources and locations remote from each other and from the semiconductor process system 200.

Figure 3B:
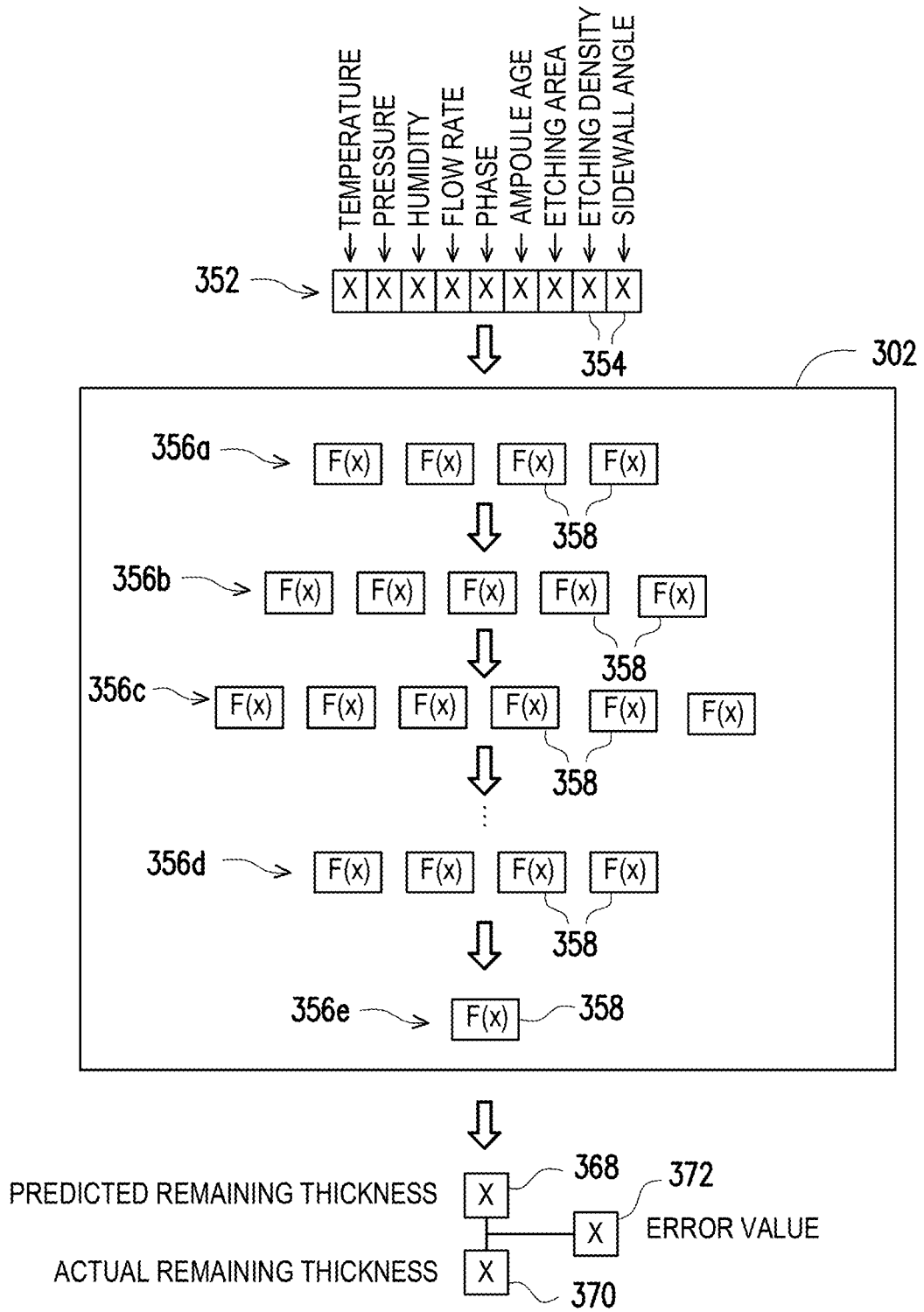
FIG. 3B is a block diagram of an analysis model, according to one embodiment.

FIG. 3B is a block diagram illustrating operational aspects and training aspects of the analysis model 302 of FIG. 3A, according to one embodiment. The analysis model 302 can be used to select parameters for ALE processes performed by the semiconductor process system 200 of FIG. 2A to form the integrated circuit 100 of FIGS. 1A-1Q. As described previously, the training set data 306 includes data related to a plurality of previously performed thin-film etching processes. Each previously performed thin-film etching process took place with particular process conditions and resulted in a thin-film having particular characteristics. The process conditions for each previously performed thin-film etching process are formatted into a respective process conditions vector 352. The process conditions vector includes a plurality of data fields 354. Each data field 354 corresponds to a particular process condition.

The example of FIG. 3B illustrates a single process conditions vector 352 that will be passed to the analysis model 302 during the training process. In the example of FIG. 3B, the process conditions vector 352 includes nine data fields 354. A first data field 354 corresponds to the temperature during the previously performed thin-film etching process. A second data field 356 corresponds to the pressure during the previously performed thin-film etching process. A third data field 354 corresponds to the humidity during the previously performed thin-film etching process. The fourth data field 354 corresponds to the flow rate of etching materials during the previously performed thin-film etching process. The fifth data field 354 corresponds to the phase (liquid, solid, or gas) of etching materials during the previously performed thin-film etching process. The sixth data field 354 corresponds to the age of the ampoule used in the previously performed thin-film etching process. The seventh data field 354 corresponds to a size of an etching area on a wafer during the previously performed thin-film etching process. The eighth data field 354 corresponds to the density of surface features of the wafer utilized during the previously performed thin-film etching process. The ninth data field corresponds to the angle of sidewalls of surface features during the previously performed thin-film etching process. In practice, each process conditions vector 352 can include more or fewer data fields than are shown in FIG. 3B without departing from the scope of the present disclosure. Each process conditions vector 352 can include different types of process conditions without departing from the scope of the present disclosure. The particular process conditions illustrated in FIG. 3B are given only by way of example. Each process condition is represented by a numerical value in the corresponding data field 354. For condition types that are not naturally represented in numbers, such as material phase, a number can be assigned to each possible phase.

The analysis model 302 includes a plurality of neural layers 356a-e. Each neural layer includes a plurality of nodes 358. Each node 358 can also be called a neuron. Each node 358 from the first neural layer 356a receives the data values for each data field from the process conditions vector 352. Accordingly, in the example of FIG. 3B, each node 358 from the first neural layer 356a receives nine data values because the process conditions vector 352 has nine data fields. Each neuron 358 includes a respective internal mathematical function labeled F(x) in FIG. 3B. Each node 358 of the first neural layer 356a generates a scalar value by applying the internal mathematical function F(x) to the data values from the data fields 354 of the process conditions vector 352. Further details regarding the internal mathematical functions F(x) are provided below.

Each node 358 of the second neural layer 356b receives the scalar values generated by each node 358 of the first neural layer 356a. Accordingly, in the example of FIG. 3B each node of the second neural layer 356b receives four scalar values because there are four nodes 358 in the first neural layer 356a. Each node 358 of the second neural layer 356b generates a scalar value by applying the respective internal mathematical function F(x) to the scalar values from the first neural layer 356a.

Each node 358 of the third neural layer 356c receives the scalar values generated by each node 358 of the second neural layer 356b. Accordingly, in the example of FIG. 3B each node of the third neural layer 356c receives five scalar values because there are five nodes 358 in the second neural layer 356b. Each node 358 of the third neural layer 356c generates a scalar value by applying the respective internal mathematical function F(x) to the scalar values from the nodes 358 of the second neural layer 356b.

Each node 358 of the neural layer 356d receives the scalar values generated by each node 358 of the previous neural layer (not shown). Each node 358 of the neural layer 356d generates a scalar value by applying the respective internal mathematical function F(x) to the scalar values from the nodes 358 of the second neural layer 356b.

The final neural layer includes only a single node 358. The final neural layer receives the scalar values generated by each node 358 of the previous neural layer 356d. The node 358 of the final neural layer 356e generates a data value 368 by applying a mathematical function F(x) to the scalar values received from the nodes 358 of the neural layer 356d.

In the example of FIG. 3B, the data value 368 corresponds to the predicted remaining thickness of a thin film generated by process conditions data corresponding to values included in the process conditions vector 352. In other embodiments, the final neural layer 356e may generate multiple data values each corresponding to a particular thin-film characteristic such as thin-film crystal orientation, thin-film uniformity, or other characteristics of a thin film. The final neural layer 356e will include a respective node 358 for each output data value to be generated. In the case of a predicted thin film thickness, engineers can provide constraints that specify that the predicted thin film thickness 368 must fall within a selected range, such as between 0 nm and 50 nm, in one example. The analysis model 302 will adjust internal functions F(x) to ensure that the data value 368 corresponding to the predicted thin film thickness will fall within the specified range.

During the machine learning process, the analysis model compares the predicted remaining thickness in the data value 368 to the actual remaining thickness of the thin-film as indicated by the data value 370. As set forth previously, the training set data 306 includes, for each set of historical process conditions data, thin-film characteristics data indicating the characteristics of the thin-film that resulted from the historical thin-film etching process. Accordingly, the data field 370 includes the actual remaining thickness of the thin-film that resulted from the etching process reflected in the process conditions vector 352. The analysis model 302 compares the predicted remaining thickness from the data value 368 to the actual remaining thickness from the data value 370. The analysis model 302 generates an error value 372 indicating the error or difference between the predicted remaining thickness from the data value 368 and the actual remaining thickness from the data value 370. The error value 372 is utilized to train the analysis model 302.

The training of the analysis model 302 can be more fully understood by discussing the internal mathematical functions F(x). While all of the nodes 358 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 358 in the previous neural layer, or, in the case of the first neural layer 356a, each value $x_1$-$x_n$ corresponds to a respective data value from the data fields 354 of the process conditions vector 352. Accordingly, n for a given node is equal to the number of nodes in the previous neural layer. The values $w_1$-$w_n$ are scalar weighting values associated with a corresponding node from the previous layer. The analysis model 302 selects the values of the weighting values $w_1$-$w_n$. The constant b is a scalar biasing value and may also be multiplied by a weighting value. The value generated by a node 358 is based on the weighting values $w_1$-$w_n$. Accordingly, each node 358 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 372 has been calculated, the analysis model 302 adjusts the weighting values $w_1$-$w_n$ for the various nodes 358 of the various neural layers 356a-356e.

After the analysis model 302 adjusts the weighting values $w_1$-$w_n$, the analysis model 302 again provides the process conditions vector 352 to the input neural layer 356a. Because the weighting values are different for the various nodes 358 of the analysis model 302, the predicted remaining thickness 368 will be different than in the previous iteration. The analysis model 302 again generates an error value 372 by comparing the actual remaining thickness 370 to the predicted remaining thickness 368.

The analysis model 302 again adjusts the weighting values $w_1$-$w_n$ associated with the various nodes 358. The analysis model 302 again processes the process conditions vector 352 and generates a predicted remaining thickness 368 and associated error value 372. The training process includes adjusting the weighting values $w_1$-$w_n$ in iterations until the error value 372 is minimized.

FIG. 3B illustrates a single process conditions vector 352 being passed to the analysis model 302. In practice, the training process includes passing a large number of process conditions vectors 352 through the analysis model 302, generating a predicted remaining thickness 368 for each process conditions vector 352, and generating associated error value 372 for each predicted remaining thickness. The training process can also include generating an aggregated error value indicating the average error for all the predicted remaining thicknesses for a batch of process conditions vectors 352. The analysis model 302 adjusts the weighting values $w_1$-$w_n$ after processing each batch of process conditions vectors 352. The training process continues until the average error across all process conditions vectors 352 is less than a selected threshold tolerance. When the average error is less than the selected threshold tolerance, the analysis model 302 training is complete and the analysis model is trained to accurately predict the thickness of thin films based on the process conditions. The analysis model 302 can then be used to predict thin-film thicknesses and to select process conditions that will result in a desired thin-film thickness. During use of the trained model 302, a process conditions vector, representing current process condition for a current thin film etching process to be performed, and having the same format at the process conditions vector 352, is provided to the trained analysis model 302. The trained analysis model 302 can then predict the thickness of a thin film that will result from those process conditions.

A particular example of a neural network based analysis model 302 has been described in relation to FIG. 3B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 4:
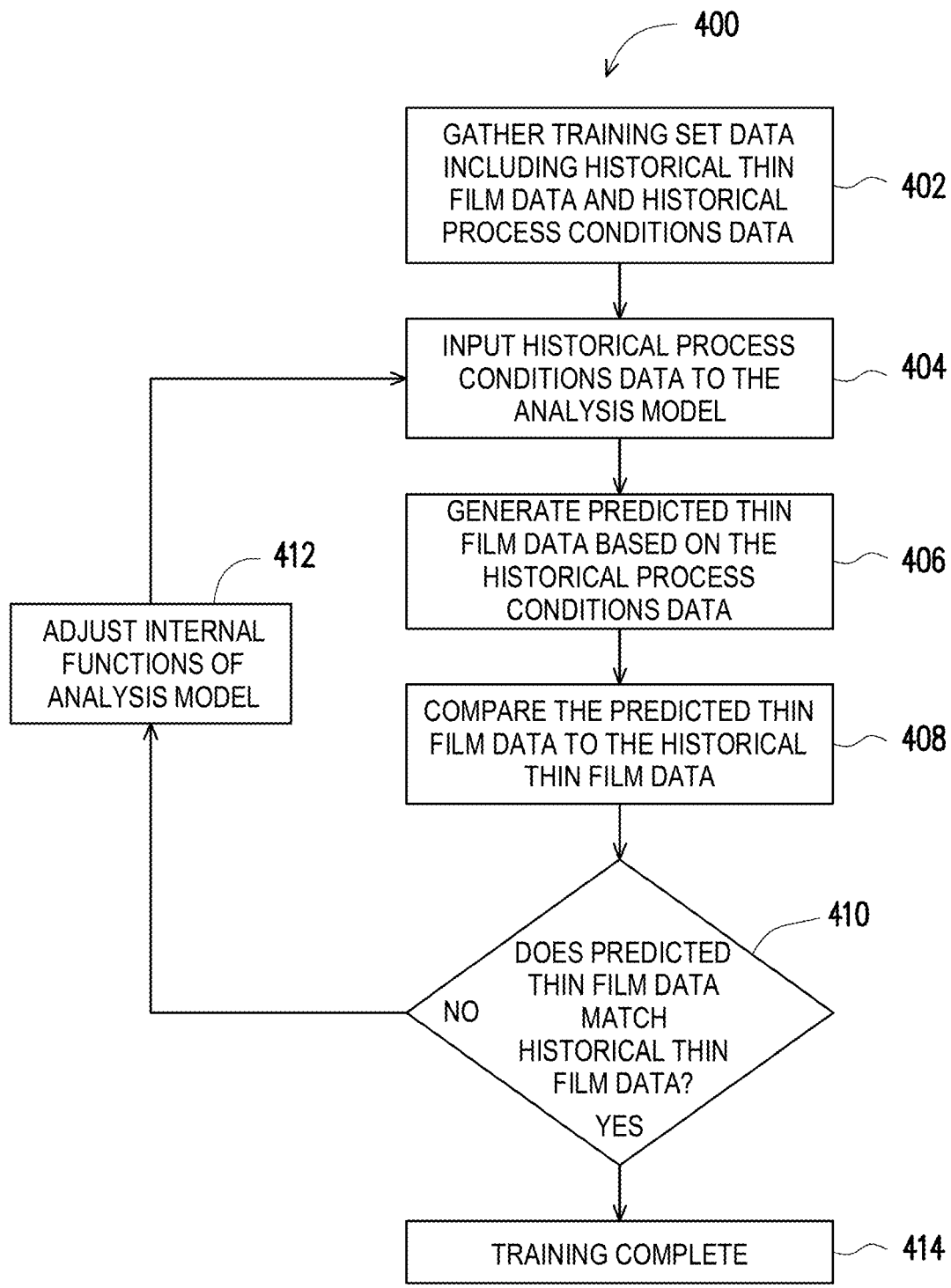
FIG. 4 is flow diagram of a process for training an analysis model of a control system, according to one embodiment.

FIG. 4 is a flow diagram of a process 400 for training an analysis model to identify process conditions that will result in proper etching of a thin film, according to one embodiment. One example of an analysis model is the analysis model 302 of FIG. 3A. The various steps of the process 400 can utilize components, processes, and techniques described in relation to FIGS. 1A-3B. Accordingly, FIG. 4 is described with reference to FIGS. 1A-3B.

At 402, the process 400 gathers training set data including historical thin-film data and historical process conditions data. This can be accomplished by using a data mining system or process. The data mining system or process can gather training set data by accessing one or more databases associated with the semiconductor process system 200 and collecting and organizing various types of data contained in the one or more databases. The data mining system or process, or another system or process, can process and format the collected data in order to generate a training set data. The training set data 306 can include historical thin-film data 308 and historical process conditions data 310 as described in relation to FIG. 3A.

At 404, the process 400 inputs historical process conditions data to the analysis model. In one example, this can include inputting historical process conditions data 310 into the analysis model 302 with the training module 304 as described in relation to FIG. 3A. The historical process conditions data can be provided in consecutive discrete sets to the analysis model 302. Each district set can correspond to a single thin-film etching process or a portion of a single thin-film etching process. The historical process conditions data can be provided as vectors to the analysis model 302. Each set can include one or more vectors formatted for reception processing by the analysis model 302. The historical process conditions data can be provided to the analysis model 302 in other formats without departing from the scope of the present disclosure.

At 406, the process 400 generates predicted thin-film data based on historical process conditions data. In particular, the analysis model 302 generates, for each set of historical thin-film conditions data 310, predicted thin-film data. The predicted thin-film data corresponds to a prediction of characteristics, such as the remaining thickness, of a thin film that would result from that particular set of process conditions. The predicted thin-film data can include thickness, uniformity, composition, crystal structure, or other aspects of a remaining thin film.

At 408, the predicted thin-film data is compared to the historical thin-film data 308. In particular, the predicted thin-film data for each set of historical process conditions data is compared to the historical thin-film data 308 associated with that set of historical process conditions data. The comparison can result in an error function indicating how closely the predicted thin-film data matches the historical thin-film data 308. This comparison is performed for each set of predicted thin-film data. In one embodiment, this process can include generating an aggregated error function or indication indicating how the totality of the predicted thin-film data compares to the historical thin-film data 308. These comparisons can be performed by the training module 304 or by the analysis model 302. The comparisons can include other types of functions or data than those described above without departing from the scope of the present disclosure.

At 410, the process 400 determines whether the predicted thin-film data matches the historical thin-film data based on the comparisons generated at step 408. For example, the process determines whether the predicted remaining thickness matches the actual remaining thickness after a historical etching process. In one example, if the aggregate error function is less than an error tolerance, then the process 400 determines that the thin-film data does not match the historical thin-film data. In one example, if the aggregate error function is greater than an error tolerance, then the process 400 determines that the thin-film data does match the historical thin-film data. In one example, the error tolerance can include a tolerance between 0.1 and 0. In other words, if the aggregate percentage error is less than 0.1, or 10%, then the process 400 considers that the predicted thin-film data matches the historical thin-film data. If the aggregate percentage error is greater than 0.1 or 10%, then the process 400 considers that the predicted thin-film data does not match the historical thin-film data. Other tolerance ranges can be utilized without departing from the scope of the present disclosure. Error scores can be calculated in a variety of ways without departing from the scope of the present disclosure. The training module 304 or the analysis model 302 can make the determinations associated with process step 410.

In one embodiment, if the predicted thin-film data does not match the historical thin-film data 308 at step 410, then the process proceeds to step 412. At step 412, the process 400 adjusts the internal functions associated with the analysis model 302. In one example, the training module 304 adjusts the internal functions associated with the analysis model 302. From step 412, the process returns to step 404. At step 404, the historical process conditions data is again provided to the analysis model 302. Because the internal functions of the analysis model 302 have been adjusted, the analysis model 302 will generate different predicted thin-film data that in the previous cycle. The process proceeds to steps 406, 408 and 410 and the aggregate error is calculated. If the predicted thin-film data does not match the historical thin-film data, then the process returns to step 412 and the internal functions of the analysis model 302 are adjusted again. This process proceeds in iterations until the analysis model 302 generates predicted thin-film data that matches the historical thin-film data 308.

In one embodiment, if the predicted thin-film data matches the historical thin-film data then process step 410, in the process 400, proceeds to 414. At step 414 training is complete. The analysis model 302 is now ready to be utilized to identify process conditions and can be utilized in thin-film etching processes performed by the semiconductor process system 200. The process 400 can include other steps or arrangements of steps than shown and described herein without departing from the scope of the present disclosure.

Figure 5:
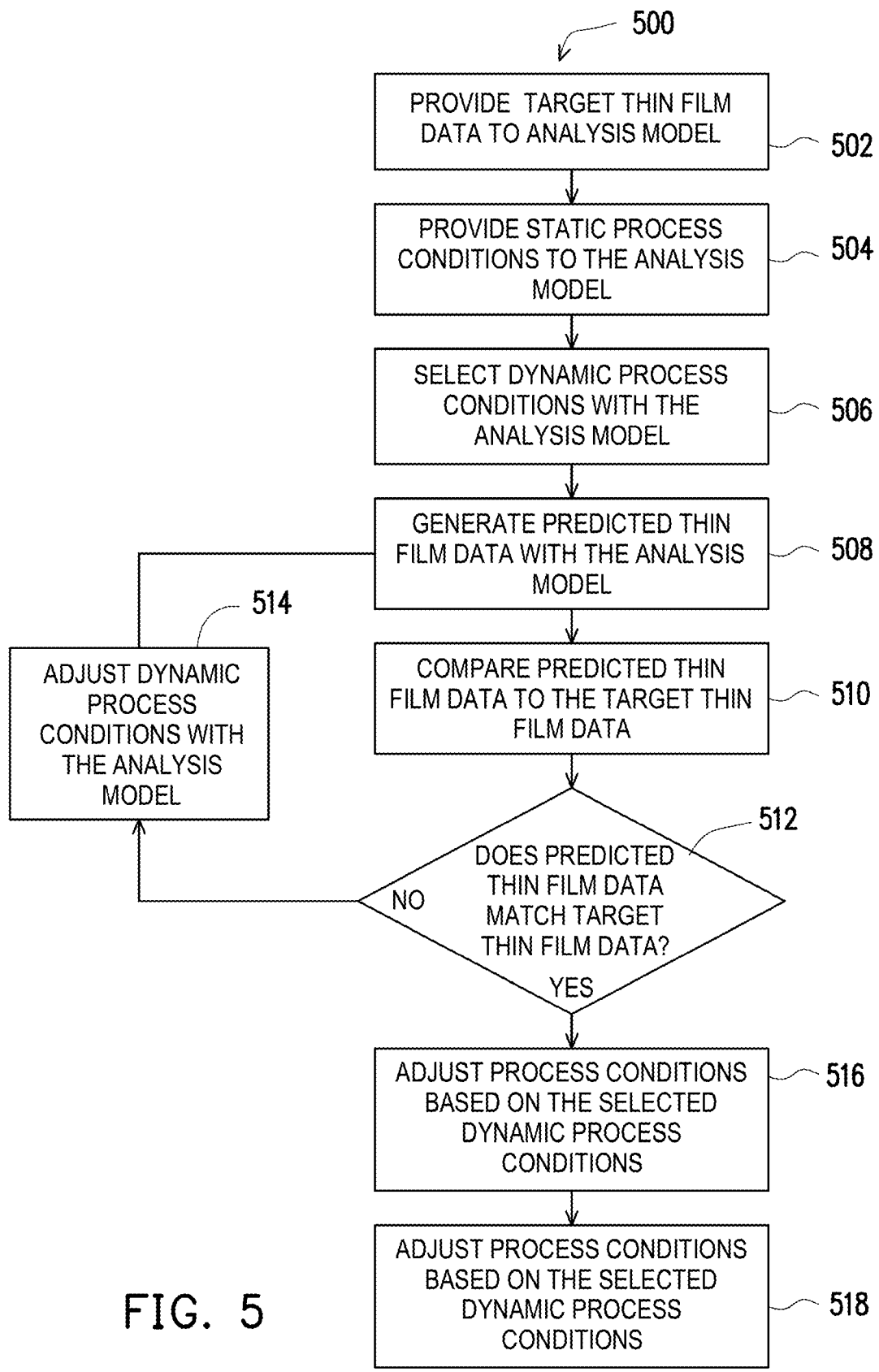
FIG. 5 is a flow diagram of a process for performing a thin-film deposition process in conjunction with an analysis model, according to one embodiment.

FIG. 5 is a flow diagram of a process 500 for dynamically selecting process conditions for thin-film etching process and for performing a thin-film etching process, according to one embodiment. The various steps of the process 500 can utilize components, processes, and techniques described in relation to FIGS. 1A-4. Accordingly, FIG. 5 is described with reference to FIGS. 1A-4.

At 502, the process 500 provides target thin-film conditions data to the analysis model 302. The target thin-film conditions data identifies selected characteristics of a thin film to be formed by thin-film etching process. The target thin-film conditions data can include a target remaining thickness, a target composition, target crystal structure, or other characteristics of the thin film. The target thin-film conditions data can include a range of thicknesses. The target condition or characteristics that can be selected are based on thin film characteristic(s) utilized in the training process. In the example of FIG. 5, the training process focused on thin film thickness.

At 504, the process 500 provides static process conditions to the analysis model 302. The static process conditions include process conditions that will not be adjusted for a next thin-film etching process. The static process conditions can include the target device pattern density indicating the density of patterns on the wafer on which the thin-film etching process will be performed. The static process conditions can include an effective plan area crystal orientation, an effective plan area roughness index, an effective sidewall area of the features on the surface of the semiconductor wafer, an exposed effective sidewall tilt angle, an exposed surface film function group, an exposed sidewall film function group, a rotation or tilt of the semiconductor wafer, process gas parameters (materials, phase of materials, and temperature of materials), a remaining amount of material fluid in the fluid sources 208 and 210, a remaining amount of fluid in the purge sources 212 and 214, a humidity within a process chamber, an age of an ampoule utilized in the etching process, light absorption or reflection within the process chamber, the length of pipes or conduits that will provide fluids to the process chamber, or other conditions. The static process conditions can include conditions other than those described above without departing from the scope of the present disclosure. Furthermore, in some cases, some of the static process conditions listed above may be dynamic process conditions subject to adjustment as will be described in more detail below. In the example of FIG. 5, dynamic process conditions include temperature, pressure, humidity, and flow rate. Static process conditions include phase, ampoule age, etching area, etching density, and sidewall angle.

At 506, the process 500 selects dynamic process conditions for the analysis model, according to one embodiment. The dynamic process conditions can include any process conditions not designated as static process conditions. For example, the training set data may include a large number of various types of process conditions data in the historical process conditions data 310. Some of these types of process conditions will be defined the static process conditions and some of these types of process conditions will be defined as dynamic process conditions. Accordingly, when the static process conditions are supplied at step 504, the remaining types of process conditions can be defined as dynamic process conditions. The analysis model 302 can initially select initial values for the dynamic process conditions. After the initial values have been selected for the dynamic process conditions, the analysis model has a full set of process conditions to analyze. In one embodiment, the initial values for the dynamic process conditions may be selected based on previously determined starter values, or in accordance with other schemes.

The dynamic process conditions can include the flow rate of fluids or materials from the fluid sources 208 and 210 during the etching process. The dynamic process conditions can include the flow rate of fluids or materials from the purge sources 212 and 214. The dynamic process conditions can include a pressure within the process chamber, a temperature within the process chamber, a humidity within the process chamber, durations of various steps of the etching process, or voltages or electric field generated within the process chamber. The dynamic process conditions can include other types of conditions without departing from the scope of the present disclosure.

At 508, the analysis model 302 generates predicted thin-film data based on the static and dynamic process conditions. The predicted thin-film data includes the same types of thin-film characteristics established in the target thin-film conditions data. In particular, the predicted thin-film data includes the types of predicted thin-film data from the training process described in relation to FIGS. 2A-4. For example, the predicted thin-film data can include thin-film thickness, film composition, or other parameters of thin films.

At 510, the process compares the predicted thin-film data to the target thin-film data. In particular, the analysis model 302 compares the predicted thin-film data to the target thin-film data. The comparison indicates how closely the predicted thin-film data matches the target thin-film data. The comparison can indicate whether or not predicted thin-film data falls within tolerances or ranges established by the target thin-film data. For example, if the target thin-film thickness is between 1 nm and 9 nm, then the comparison will indicate whether the predicted thin-film data falls within this range.

At 512, if the predicted thin-film data does not match the target thin-film data, then the process proceeds to 514. At 514, the analysis model 302 adjusts the dynamic process conditions data. From 514 the process returns to 508. At 508, the analysis model 302 again generates predicted thin-film data based on the static process conditions and the adjusted dynamic process conditions. The analysis model then compares the predicted thin-film data to the target thin-film data at 510. At 512, if the predicted thin-film data does not match the target thin-film data, then the process proceeds to 514 and the analysis model 302 again adjusts the dynamic process conditions. This process proceeds until predicted thin-film data is generated that matches the target thin-film data. If the predicted thin-film data matches the target thin-film data 512, then the process proceeds to 516.

At 516, the process 500 adjusts the thin-film process conditions of the semiconductor process system 200 based on the dynamic process conditions that resulted in predicted thin-film data within the target thin-film data. For example, the control system 224 can adjust fluid flow rates, etching step durations, pressure, temperature, humidity, or other factors in accordance with the dynamic process conditions data.

At 518, the semiconductor process system 200 performs a thin-film etching process in accordance with the adjusted dynamic process conditions identified by the analysis model. In one embodiment, the thin-film etching process is an ALE process. However, other thin-film etching processes can be utilized without departing from the scope of the present disclosure. In one embodiment, the semiconductor process system 200 adjusts the process parameters based on the analysis model between individual etching stages in a thin-film etching process. For example, in an ALE process, the thin-film is etched one layer at a time. The analysis model 302 can identify parameters to be utilized for etching of the next layer. Accordingly, the semiconductor process system can adjust etching conditions between the various etching stages.

In one embodiment, an integrated circuit includes an interlevel dielectric layer and a transistor. The transistor includes a trench formed in the interlevel dielectric layer, a gate dielectric positioned on a bottom of the trench, and a gate electrode. The gate electrode includes a gate metal positioned on the gate dielectric at the bottom of the trench, a silicide positioned in the trench above the gate metal, and a conductive gate fill material positioned over the gate metal and the silicide in the trench. The conductive gate fill material extends to a higher vertical level within the trench than the gate metal.

In one embodiment, a method includes forming a trench in an interlevel dielectric layer over a plurality of first semiconductor nanosheets corresponding to channel regions of a first transistor. The method includes depositing a gate dielectric on a bottom of the trench, depositing a gate metal of the transistor in the trench on the gate dielectric, forming a silicide above the first gate metal in the trench. The method includes and filling the trench with a conductive gate fill material over the first gate metal and the silicide. The conductive gate fill material extends to a higher vertical level within the trench than does the gate metal.

In one embodiment, a method includes training an analysis model with a machine learning process to select parameters for an atomic layer etching process. The method includes depositing a gate metal of a transistor in a trench in an interlevel dielectric layer of an integrated circuit, selecting, with the analysis model, etching parameters for etching the gate metal, and etching the gate metal with the atomic layer etching process based on the selected etching parameters. The method includes forming a silicide over the gate metal in the trench.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a first trench in an interlevel dielectric layer over a plurality of first semiconductor nanosheets corresponding to channel regions of a first transistor;
depositing a first gate dielectric on a bottom of the first trench;
depositing a first gate metal of the first transistor in the first trench, the first gate metal having a first material in direct physical contact with a first portion of a sidewall of first the gate dielectric in the first trench;
depositing a second gate metal in the first trench on the first gate metal, the second gate metal having a second material different from the first material and in direct physical contact with a second portion of the sidewall of the first gate dielectric in the first trench above the first portion of the sidewall of the first gate dielectric;
depositing a third gate metal in the first trench on the second gate metal and in direct physical contact with a third portion of the sidewall of the gate dielectric in the first trench above the second portion of the sidewall of the first gate dielectric, wherein the second gate metal is between the first gate metal and the third gate metal;
forming a first silicide above the third gate metal in the trench; and
filling the first trench with a first conductive gate fill material over the first gate metal, the second gate metal, the third gate metal, and the silicide, wherein an entirety of the first gate metal and an entirety of the second gate metal are below an entirety of the silicide in the first trench, wherein the first gate metal, the second gate metal, and the third gate metal surround the first semiconductor nanosheets, wherein the third gate metal, the first silicide, and the first gate fill material extend to a same height.

2. The method of claim 1, wherein forming the first silicide includes:
forming a silicon layer in the first trench by flowing silane in the first trench; and
depositing titanium on the silicon layer.

3. The method of claim 1, further comprising:
selecting parameters for an atomic layer etching process of the first gate metal; and
prior to filling the first trench with the first conductive gate fill material, patterning the first gate metal within the first trench with the atomic layer etching process.

4. The method of claim 3, further comprising selecting the parameters for the atomic layer etching process with an analysis model trained with a machine learning process.

5. The method of claim 1, further comprising:
forming a second trench in the interlevel dielectric layer over a plurality of second semiconductor nanosheets corresponding to channel regions of a second transistor;
depositing a second gate dielectric on a bottom of the second trench;
forming a second silicide over the gate dielectric in the second trench;
filling the second trench with a second conductive gate fill material, wherein the second conductive gate fill material of the second transistor is positioned closer to the bottom of the second trench than the first conductive gate fill material of the first transistor is positioned to the bottom of the first trench.

6. The method of claim 5, further comprising, prior to depositing the first gate fill material, etching the gate dielectric from sidewalls of the first trench with an ALE process having parameters selected by an analysis model trained with a machine learning process.

7. A method, comprising:
forming an interlevel dielectric layer in an integrated circuit;
forming a first transistor including:
forming a first trench in the interlevel dielectric layer above a plurality of first semiconductor nanosheets co;
depositing a first gate dielectric on a bottom and on sidewalls of the first trench; and
forming a first gate electrode, including:
depositing a first gate metal having a first material and positioned in direct physical contact with a first portion of a sidewall of the first gate dielectric in the first trench;
depositing a second gate metal in the first trench on the first gate metal, the second gate metal having a second material different from the first material and in direct physical contact with a second portion of the sidewall of the first gate dielectric in the first trench above the first portion of the sidewall of the first gate dielectric;
depositing a third gate metal in the first trench on the second gate metal and in direct physical contact with a third portion of the sidewall of the gate dielectric in the first trench above the second portion of the sidewall of the gate dielectric, wherein the second gate metal is between the first gate metal and the third gate metal;
depositing a first silicide in the first trench above the second gate metal; and
depositing a first conductive gate fill material positioned over the first gate metal and the first silicide in the first trench, wherein the first conductive gate fill material extends to a higher vertical level within the first trench than the first gate metal, wherein an entirety of first gate metal and an entirety of the second gate metal are below an entirety of the first silicide in the first trench, wherein the first gate metal, the second gate metal, and the third gate metal surround the first semiconductor nanosheets, wherein the third gate metal, the first silicide, and the first gate fill material extend to a same height.

8. The method of claim 7, wherein the first silicide is titanium silicide.

9. The method of claim 7, wherein the first gate dielectric layer and the gate electrode surround the semiconductor nanosheets.

10. The method of claim 9, wherein the first conductive gate fill material extends higher within the first trench than the first gate dielectric.

11. The method of claim 10, wherein the first gate dielectric includes hafnium.

12. The method of claim 9, further comprising:
forming a second transistor including:
forming a second trench in the interlevel dielectric layer over a plurality of second semiconductor nanosheets corresponding to channels of a second transistor;
depositing a second gate dielectric positioned on a bottom of the second trench;
forming a gate electrode, including depositing a second silicide and a second conductive gate fill material in the second trench above the second gate dielectric, the second conductive gate fill material of the second transistor being positioned closer to the bottom of the second trench than the first conductive gate fill material of the first transistor is positioned to the bottom of the first trench.

13. The method of claim 12, wherein the first transistor has a higher threshold voltage than the second transistor.

14. The method of claim 7, wherein the first gate metal is titanium nitride.

15. The method of claim 14, wherein the first conductive gate fill material includes tungsten.

16. A method, comprising:
forming a plurality of first semiconductor nanosheets corresponding to channel regions of a first transistor; and
forming a first gate structure of the first transistor above the first semiconductor nanosheets including:
forming a first trench in an interlevel dielectric layer above the first semiconductor nanosheets;
forming a first gate dielectric on a bottom of the first trench;
forming a first gate metal in the first trench and having a first material in direct physical contact with a first portion of a sidewall of the first gate dielectric in the first trench;
forming a second gate metal on the first gate metal in the first trench and having a second material different from the first material and in direct physical contact with a second portion of the sidewall of the first gate dielectric above the first portion of the sidewall of the first gate dielectric;
depositing a third gate metal in the first trench on the second gate metal and in direct physical contact with a third portion of the sidewall of the first gate dielectric in the first trench above the second portion of the sidewall of the gate dielectric, wherein the second gate metal is between the first gate metal and the third gate metal;
forming a first silicide above the second gate metal in the first trench;
forming a first conductive gate fill material over the first gate metal and the silicide, wherein the conductive gate fill material extends to a higher vertical level within the first trench than does the first gate metal, wherein an entirety of first gate metal and an entirety of the second gate metal are below an entirety of the silicide in the first trench, wherein the first gate metal, the second gate metal, and the third gate metal surround the first semiconductor nanosheets, wherein the third gate metal, the silicide, and the gate fill material extend to a same height;
forming a plurality of second semiconductor nanosheets corresponding to channel regions of a second transistor; and
forming a second gate structure of the second transistor above the second semiconductor nanosheets including:
forming a second trench in the interlevel dielectric layer above the second semiconductor nanosheets;
forming a second gate dielectric in the second trench;
forming a fourth gate metal over the second gate dielectric in the second trench;
forming a second silicide above the fourth gate metal in the second trench;
forming a second conductive gate fill material over the fourth gate metal and the second silicide in the second trench, wherein the second conductive gate fill material is positioned closer to the second nanosheets than the first conductive gate fill material is to the first nanosheets.

17. The method of claim 16, wherein the first gate dielectric includes hafnium.

18. The method of claim 17, wherein the first transistor has a higher threshold voltage than the second transistor.

19. The method of claim 16, wherein forming the first silicide incudes:
forming a silicon layer in the first trench by flowing silane into the first trench; and
depositing titanium on the silicon layer.

20. The method of claim 16, wherein the third gate metal is titanium nitride.

* * * * *